US011362764B2

(12) United States Patent
Yokomakura et al.

(10) Patent No.: US 11,362,764 B2
(45) Date of Patent: Jun. 14, 2022

(54) BASE STATION APPARATUS, TERMINAL APPARATUS, COMMUNICATION METHOD, AND INTEGRATED CIRCUIT

(71) Applicants: SHARP KABUSHIKI KAISHA, Osaka (JP); FG INNOVATION COMPANY LIMITED, Tuen Mun (HK)

(72) Inventors: Kazunari Yokomakura, Sakai (JP); Shohei Yamada, Sakai (JP); Hidekazu Tsuboi, Sakai (JP); Hiroki Takahashi, Sakai (JP); Tatsushi Aiba, Sakai (JP)

(73) Assignees: FG Innovation Company Limited, Hong Kong (HK); Sharp Kabushiki Kaisha, Osaka (JP)

( * ) Notice: Subject to any disclaimer, the term of this patent is extended or adjusted under 35 U.S.C. 154(b) by 18 days.

(21) Appl. No.: 16/314,949

(22) PCT Filed: Jul. 7, 2017

(86) PCT No.: PCT/JP2017/024947
§ 371 (c)(1),
(2) Date: Jan. 3, 2019

(87) PCT Pub. No.: WO2018/008739
PCT Pub. Date: Jan. 11, 2018

(65) Prior Publication Data
US 2019/0312675 A1  Oct. 10, 2019

(30) Foreign Application Priority Data
Jul. 8, 2016  (JP) .............................. JP2016-135741

(51) Int. Cl.
*H04L 1/00* (2006.01)
*H03M 13/09* (2006.01)
*H04L 27/01* (2006.01)
*H04L 27/26* (2006.01)
*H04W 80/02* (2009.01)

(52) U.S. Cl.
CPC .......... *H04L 1/0057* (2013.01); *H03M 13/09* (2013.01); *H04L 1/00* (2013.01); *H04L 27/01* (2013.01); *H04L 27/26* (2013.01); *H04L 27/2602* (2013.01); *H04W 80/02* (2013.01)

(58) Field of Classification Search
None
See application file for complete search history.

(56) References Cited

U.S. PATENT DOCUMENTS 9,264,675 B2 *  2/2016  Antia ..................... H04N 7/20
2004/0268206 A1 * 12/2004  Kim ......................... H04L 1/06
714/758

(Continued)

FOREIGN PATENT DOCUMENTS

JP  2012170080 A  *  9/2012
JP  2016-513929 A      3/2014
(Continued)

OTHER PUBLICATIONS

NTT Docomo, "Revision of SI: Study on New Radio Access Technology", 3GPP TSG RAN Meeting #72 RP-161214 Busan, Korea, Jun. 13-16, 2016.

(Continued)

*Primary Examiner* — April Y Blair
*Assistant Examiner* — Matthew W Wahlin
(74) *Attorney, Agent, or Firm* — Imperium Patent Works

(57) ABSTRACT

Provided is a coding unit to determine the number of code block groups, divide an input bit sequence to code block segmentation into code block groups of the number of the code block groups, determine the number of code blocks for each of the code block groups, divide each of the code block groups into code blocks of the number of the code blocks, and apply channel coding to each of the code blocks.

9 Claims, 18 Drawing Sheets

(56) References Cited

U.S. PATENT DOCUMENTS

| | | | |
|---|---|---|---|
| 2011/0080975 A1* | 4/2011 | Toda | H04L 1/1819 375/295 |
| 2012/0005550 A1* | 1/2012 | Ito | H04L 1/0009 714/748 |
| 2016/0036578 A1 | 2/2016 | Malladi et al. | H04L 5/00 |

FOREIGN PATENT DOCUMENTS

| | | | | |
|---|---|---|---|---|
| JP | 2016513929 A | 5/2016 | | |
| WO | WO-2008114957 A1 * | 9/2008 | | H04L 1/0041 |
| WO | WO 2010/109521 | 3/2009 | | |
| WO | 2016/126330 A1 | 8/2016 | | |

OTHER PUBLICATIONS

Samsung, "Flexibility of LDPC—Length, Rate and IR-HARQ", 3GPP TSG RAN WG1 #85 R1-164007, Nanjing, China, May 23-27, 2016.

Intel Corporation, "LDPC code design for NR", 3GPP TSG RAN WG1 Meeting #85 R1-164183, Nanjing, China, May 23-27, 2016.

Ericsson, "Turbo Code Enhancements", 3GPP TSG RAN WG1 Meeting #85 R1-164361, Nanjing, China May 23-27, 2016.

Nokia, Alcatel-Lucent Shanghai Bell, "CRC attachment for eMBB data", 3GPP TSG-RAN WG1 #87, R1-1612279, Reno, U.S.A., Nov. 14-18, 2016.

Rongdao Yu et al.: "A Method of Code Block Segmentation", IEEE C802.16M-08/748, IEEE-SA, Piscataway, NJ USA, vol. 802.16m, Jul. 8, 2008 (Jul. 8, 2008), pp. 1-4, XP017724743, [retrieved on Jul. 8, 2008].

R. Yu et al., "A Method of Code Block Segmentation," IEEE 802.16 Broadband Wireless Access Working Group, Huawei, Jul. 7, 2008, IEEE C802.16m-08/748 (4 pages).

Pre-Exam Notice of the Japanese Patent Office in foreign related application JP 2018-526452 dated Apr. 19, 2021 (2 pages).

Office action of the Chinese Patent Office in foreign related application CN201780039088.X dated Apr. 2, 2021 (6 pages).

Office action of the Indian Patent Office in the related foreign application IN 201917001070 dated Nov. 9, 2021 (5 pages).

* cited by examiner if
    $L = 0$
    Number of code blocks: $C=1$
    $B' = B$
else
    $L = A$
    Number of code blocks: $C = \lceil B/(Z-L) \rceil$
    $B' = B + C \cdot L$
end if

FIG. 3

Number of bits in each code block (applicable for $C \neq 0$ only):

First segmentation size: $K_+$ = minimum $K$ in Figure 5 such that $C \cdot K \geq B'$ if $C = 1$ the number of code blocks with length $K_+$ is $C_+ = 1$, $K_- = 0$, $C_- = 0$ else if $C > 1$ Second segmentation size: $K_-$ = maximum $K$ in Figure 5 such that $K < K_+$ $\Delta_K = K_+ - K_-$ Number of segments of size $K_-$ : $C_- = \left\lfloor \dfrac{C \cdot K_+ - B'}{\Delta_K} \right\rfloor$.

Number of segments of size $K_+$ : $C_+ = C - C_-$ end if

FIG. 4

Number of filler bits: $F = C_+ \cdot K_+ + C_- \cdot K_- - B'$ for $k = 0$ to $F-1$  — Insertion of filler bits
$\quad c_{0k} = <NULL>$
end for
$k = F$
$s = 0$
for $r = 0$ to $C-1$
$\quad$ if $r < C_-$
$\quad\quad K_r = K_-$
$\quad$ else
$\quad\quad K_r = K_+$
$\quad$ end if
$\quad$ while $k < K_r - L$
$\quad\quad c_{rk} = b_s$
$\quad\quad k = k + 1$
$\quad\quad s = s + 1$
$\quad$ end while
$\quad$ if $C > 1$
$\quad\quad$ The sequence $c_{r0}, c_{r1}, c_{r2}, c_{r3}, \ldots, c_{r(K_r-L-1)}$ is used to calculate the CRC parity bits $p_{r0}, p_{r1}, p_{r2}, \ldots, p_{r(L-1)}$. For CRC calculation it is assumed that filler bits, if present, have the value 0.
$\quad\quad$ while $k < K_r$
$\quad\quad\quad c_{rk} = p_{r(k+L-K_r)}$
$\quad\quad\quad k = k + 1$
$\quad\quad$ end while
$\quad$ end if
$\quad k = 0$
end for

FIG. 5

| i | K | $f_1$ | $f_2$ | i | K | $f_1$ | $f_2$ | i | K | $f_1$ | $f_2$ | i | K | $f_1$ | $f_2$ |
|---|---|---|---|---|---|---|---|---|---|---|---|---|---|---|---|
| 1 | 40 | 3 | 10 | 48 | 416 | 25 | 52 | 95 | 1120 | 67 | 140 | 142 | 3200 | 111 | 340 |
| 2 | 48 | 7 | 12 | 49 | 424 | 51 | 106 | 96 | 1152 | 35 | 72 | 143 | 3264 | 443 | 204 |
| 3 | 56 | 19 | 42 | 50 | 432 | 47 | 72 | 97 | 1184 | 19 | 74 | 144 | 3328 | 51 | 104 |
| 4 | 64 | 7 | 16 | 51 | 440 | 91 | 110 | 98 | 1216 | 39 | 76 | 145 | 3392 | 51 | 212 |
| 5 | 72 | 7 | 18 | 52 | 448 | 29 | 168 | 99 | 1248 | 19 | 78 | 146 | 3456 | 451 | 192 |
| 6 | 80 | 11 | 20 | 53 | 456 | 29 | 114 | 100 | 1280 | 199 | 240 | 147 | 3520 | 257 | 220 |
| 7 | 88 | 5 | 22 | 54 | 464 | 247 | 58 | 101 | 1312 | 21 | 82 | 148 | 3584 | 57 | 336 |
| 8 | 96 | 11 | 24 | 55 | 472 | 29 | 118 | 102 | 1344 | 211 | 252 | 149 | 3648 | 313 | 228 |
| 9 | 104 | 7 | 26 | 56 | 480 | 89 | 180 | 103 | 1376 | 21 | 86 | 150 | 3712 | 271 | 232 |
| 10 | 112 | 41 | 84 | 57 | 488 | 91 | 122 | 104 | 1408 | 43 | 88 | 151 | 3776 | 179 | 236 |
| 11 | 120 | 103 | 98 | 58 | 496 | 157 | 62 | 105 | 1440 | 149 | 60 | 152 | 3840 | 331 | 120 |
| 12 | 128 | 15 | 32 | 59 | 504 | 95 | 84 | 106 | 1472 | 45 | 92 | 153 | 3904 | 363 | 244 |
| 13 | 136 | 9 | 34 | 60 | 512 | 31 | 64 | 107 | 1504 | 49 | 846 | 154 | 3968 | 375 | 248 |
| 14 | 144 | 17 | 108 | 61 | 520 | 17 | 66 | 108 | 1536 | 71 | 48 | 155 | 4032 | 127 | 168 |
| 15 | 152 | 9 | 38 | 62 | 544 | 35 | 68 | 109 | 1568 | 13 | 28 | 156 | 4096 | 31 | 64 |
| 16 | 160 | 21 | 120 | 63 | 560 | 227 | 420 | 110 | 1600 | 17 | 80 | 157 | 4160 | 33 | 130 |
| 17 | 168 | 101 | 84 | 64 | 576 | 65 | 96 | 111 | 1632 | 25 | 102 | 158 | 4224 | 43 | 264 |
| 18 | 176 | 21 | 44 | 65 | 592 | 19 | 74 | 112 | 1664 | 183 | 104 | 159 | 4288 | 33 | 134 |
| 19 | 184 | 57 | 46 | 66 | 608 | 37 | 76 | 113 | 1696 | 55 | 954 | 160 | 4352 | 477 | 408 |
| 20 | 192 | 23 | 48 | 67 | 624 | 41 | 234 | 114 | 1728 | 127 | 96 | 161 | 4416 | 35 | 136 |
| 21 | 200 | 13 | 50 | 68 | 640 | 39 | 80 | 115 | 1760 | 27 | 110 | 162 | 4480 | 233 | 280 |
| 22 | 208 | 27 | 52 | 69 | 656 | 185 | 82 | 116 | 1792 | 29 | 112 | 163 | 4544 | 357 | 142 |
| 23 | 216 | 11 | 38 | 70 | 672 | 43 | 252 | 117 | 1824 | 29 | 114 | 164 | 4608 | 337 | 460 |
| 24 | 224 | 27 | 56 | 71 | 688 | 21 | 86 | 118 | 1856 | 57 | 116 | 165 | 4672 | 37 | 148 |
| 25 | 232 | 85 | 58 | 72 | 704 | 155 | 44 | 119 | 1888 | 45 | 354 | 166 | 4736 | 71 | 444 |
| 26 | 240 | 29 | 60 | 73 | 720 | 79 | 120 | 120 | 1920 | 31 | 120 | 167 | 4800 | 71 | 120 |
| 27 | 248 | 33 | 62 | 74 | 736 | 139 | 92 | 121 | 1952 | 59 | 810 | 168 | 4864 | 37 | 152 |
| 28 | 256 | 15 | 32 | 75 | 752 | 23 | 94 | 122 | 1984 | 185 | 124 | 169 | 4928 | 39 | 462 |
| 29 | 264 | 17 | 198 | 76 | 768 | 217 | 48 | 123 | 2016 | 113 | 420 | 170 | 4992 | 127 | 234 |
| 30 | 272 | 33 | 68 | 77 | 784 | 25 | 98 | 124 | 2048 | 31 | 64 | 171 | 5056 | 39 | 158 |
| 31 | 280 | 103 | 210 | 78 | 800 | 17 | 80 | 125 | 2112 | 17 | 66 | 172 | 5120 | 39 | 80 |
| 32 | 288 | 19 | 36 | 79 | 816 | 127 | 102 | 126 | 2176 | 171 | 136 | 173 | 5184 | 31 | 96 |
| 33 | 296 | 19 | 74 | 80 | 832 | 25 | 52 | 127 | 2240 | 209 | 420 | 174 | 5248 | 113 | 802 |
| 34 | 304 | 37 | 76 | 81 | 848 | 239 | 106 | 128 | 2304 | 253 | 216 | 175 | 5312 | 41 | 166 |
| 35 | 312 | 19 | 78 | 82 | 864 | 17 | 48 | 129 | 2368 | 367 | 444 | 176 | 5376 | 251 | 336 |
| 36 | 320 | 21 | 120 | 83 | 880 | 137 | 110 | 130 | 2432 | 265 | 456 | 177 | 5440 | 43 | 170 |
| 37 | 328 | 21 | 82 | 84 | 896 | 215 | 112 | 131 | 2496 | 181 | 468 | 178 | 5504 | 21 | 86 |
| 38 | 336 | 115 | 84 | 85 | 912 | 29 | 114 | 132 | 2560 | 39 | 80 | 179 | 5568 | 43 | 174 |
| 39 | 344 | 193 | 86 | 86 | 928 | 15 | 58 | 133 | 2624 | 27 | 164 | 180 | 5632 | 45 | 176 |
| 40 | 352 | 21 | 44 | 87 | 944 | 147 | 118 | 134 | 2688 | 127 | 504 | 181 | 5696 | 45 | 178 |
| 41 | 360 | 133 | 90 | 88 | 960 | 29 | 60 | 135 | 2752 | 143 | 172 | 182 | 5760 | 161 | 120 |
| 42 | 368 | 81 | 46 | 89 | 976 | 59 | 122 | 136 | 2816 | 43 | 88 | 183 | 5824 | 89 | 182 |
| 43 | 376 | 45 | 94 | 90 | 992 | 65 | 124 | 137 | 2880 | 29 | 300 | 184 | 5888 | 323 | 184 |
| 44 | 384 | 23 | 48 | 91 | 1008 | 55 | 84 | 138 | 2944 | 45 | 92 | 185 | 5952 | 47 | 186 |
| 45 | 392 | 243 | 98 | 92 | 1024 | 31 | 64 | 139 | 3008 | 157 | 188 | 186 | 6016 | 23 | 94 |
| 46 | 400 | 151 | 40 | 93 | 1056 | 17 | 66 | 140 | 3072 | 47 | 96 | 187 | 6080 | 47 | 190 |
| 47 | 408 | 155 | 102 | 94 | 1088 | 171 | 204 | 141 | 3136 | 13 | 28 | 188 | 6144 | 263 | 480 |

FIG. 6

Number of bits in each code block (applicable for $C \neq 0$ only):

First segmentation size: $K_+$ = minimum $K$ in Figure 5 such that $C \cdot K \geq B''$ if $C = 1$ the number of code blocks with length $K_+$ is $C_+ = 1$, $K_- = 0$, $C_- = 0$ else if $C > 1$ Second segmentation size: $K_-$ = maximum $K$ in Figure 5 such that $K < K_+$ $\Delta_K = K_+ - K_-$ Number of segments of size $K_-$: $C_- = \left\lfloor \dfrac{C \cdot K_+ - B''}{\Delta_K} \right\rfloor$.

Number of segments of size $K_+$: $C_+ = C - C_-$.

end if

FIG. 15

Number of filler bits: $F = C_+ \cdot K_+ + C_- \cdot K_- - B'$ for $k = 0$ to $F-1$ — Insertion of filler bits $c_{0k} = <NULL>$ end for $k = F$ $s = 0$ for $r = 0$ to $C-1$ if $r < C_-$ $K_r = K_-$ else $K_r = K_+$ end if while $k < K_r - L$ $c_{rk} = b_s$ $k = k + 1$ $s = s + 1$ end while if $C > 1$ The sequence $c_{r0}, c_{r1}, c_{r2}, c_{r3}, \ldots, c_{r(K_r-L-1)}$ is used to calculate the CRC parity bits $p_{r0}, p_{r1}, p_{r2}, \ldots, p_{r(L-1)}$. For CRC calculation it is assumed that filler bits, if present, have the value 0.

while $k < K_r$ $c_{rk} = p_{r(k+L-K_r)}$ $k = k + 1$ end while end if $k = 0$ end for

FIG. 16

BASE STATION APPARATUS, TERMINAL APPARATUS, COMMUNICATION METHOD, AND INTEGRATED CIRCUIT

TECHNICAL FIELD

The present invention relates to a base station apparatus, a terminal apparatus, a communication method, and an integrated circuit.

This application claims priority based on Japanese Patent Application No. 2016-filed on Jul. 8, 2016, the contents of which are incorporated herein by reference.

BACKGROUND ART

Currently, Long Term Evolution (LTE)-Advanced Pro and New Radio (NR) technology are being studied and standardization is in progress in the Third Generation Partnership Project (3GPP), as a radio access scheme and a radio network technology for the fifth generation cellular system (NPL 1).

In the fifth generation cellular system, three services, including an enhanced Mobile BroadBand (eMBB) for realizing high-speed and large-capacity transmission, an Ultra-Reliable and Low Latency Communication (URLLC) for realizing low-delay and high-reliability communication, and a massive Machine Type Communication (mMTC) in which a large number of machine-type devices such as Internet to Things (IoT) are connected, are required as assumed scenarios of service.

In NR, a Low Density Parity Check (LDPC) code and a low rate turbo code are proposed in addition to the turbo code used in LTE-Advanced Pro (NPL 2, NPL 3, NPL 4).

CITATION LIST

Non Patent Literature

NPL 1: RP-161214 NTT DOCOMO, "Revision of SI: Study on New Radio Access Technology", June, 2016
NPL 2: R1-164007, Samsung, "Flexibility of LDPC-Length, Rate and IR-HARQ", May, 2016
NPL 3: R1-164183, Intel Corporation, "LDPC code design for NR", May, 2016
NPL 4: R1-164361, Ericsson, "Turbo Code Enhancements", May, 2016

SUMMARY OF INVENTION

Technical Problem

An object of the present invention is to provide a terminal apparatus, a base station apparatus, a communication method, and an integrated circuit efficiently, by a base station apparatus and a terminal apparatus in the above-described radio communication systems.

Solution to Problem (1) To accomplish the object described above, aspects of the present invention are contrived to provide the following measures. Specifically, the base station apparatus according to one aspect of the present invention, includes a coding unit to determine the number of code block groups, divide an input bit sequence to code block segmentation into code block groups of the number of the code block groups, determine the number of code blocks for each of the code block groups, divide each of the code block groups into code blocks of the number of the code blocks, and apply channel coding to each of the code blocks.

(2) In the base station apparatus according to an aspect of the present invention, the number of the code block groups is determined based on the number of OFDM symbols.

(3) In the base station apparatus according to an aspect of the present invention, the number of code blocks in a first code block group is determined based on the number of resource elements included in one or more OFDM symbols or SC-FDMA symbols corresponding to the first code block group.

(4) In the base station apparatus according to one aspect of the present invention, the input bit sequence to the code block segmentation is a bit sequence in which a Cyclic Redundancy Check (CRC) sequence is attached to a transport block.

(5) In the base station apparatus according to one aspect of the present invention, the number of OFDM symbols or the number of SC-FDMA symbols is determined based on information indicated by a higher layer or a physical link control channel.

(6) The terminal apparatus according to one aspect of the present invention, includes a coding unit to determine the number of code block groups, divide an input bit sequence to code block segmentation into code block groups of the number of the code block groups, determine the number of code blocks for each of the code block groups, divide each of the code block groups into code blocks of the number of the code blocks, and apply channel coding to each of the code blocks.

(7) In the terminal apparatus according to one aspect of the present invention, the number of the code block groups is determined based on the number of OFDM symbols.

(8) In the terminal apparatus according to one aspect of the present invention, the number of code blocks in a first code block group is determined based on the number of resource elements included in one or more OFDM symbols corresponding to the first code block group.

(9) In the terminal apparatus according to one aspect of the present invention, the input bit sequence to the code block segmentation is a bit sequence in which a Cyclic Redundancy Check (CRC) sequence is attached to a transport block.

(10) In the terminal device according to one aspect of the present invention, the number of OFDM symbols is determined based on information indicated by a higher layer or a physical link control channel.

(11) The communication method according to one aspect of the present invention, determines the number of code block groups, divides an input bit sequence to code block segmentation into code block groups of the number of the code block groups, determines the number of code blocks for each of the code block groups, divides each of the code block groups into code blocks of the number of the code blocks, and applies channel coding to each of the code blocks.

(12) The integrated circuit according to one aspect of the present invention, includes a method for determining the number of code block groups, dividing an input bit sequence to code block segmentation into code block groups of the number of the code block groups, determine the number of code blocks for each of the code block groups, divide each of the code block groups into code blocks of the number of the code blocks, and apply channel coding to each of the code blocks.

Advantageous Effects of Invention

According to an aspect of the present invention, a base station apparatus and a terminal apparatus can efficiently communicate with each other.

BRIEF DESCRIPTION OF DRAWINGS

FIG. 3 is an example of a pseudo code for calculating the number of bits to be input to code block segmentation.

FIG. 4 is an example of a pseudo code for determining the segmentation size and the number of segments in code block segmentation.

FIG. 5 is an example of a pseudo code for determining the number of filler bits and the number of code block size in code block segmentation.

FIG. 6 is a diagram illustrating a value of each parameter in a turbo internal interleaver.

FIG. 15 is an example of a pseudo code for calculating the number of bits to be input to code block segmentation.

FIG. 16 is an example of pseudo codes for determining the segmentation size and the number of segments in code block segmentation.

DESCRIPTION OF EMBODIMENTS

Embodiments of the present invention will be described below.

Figure 1:
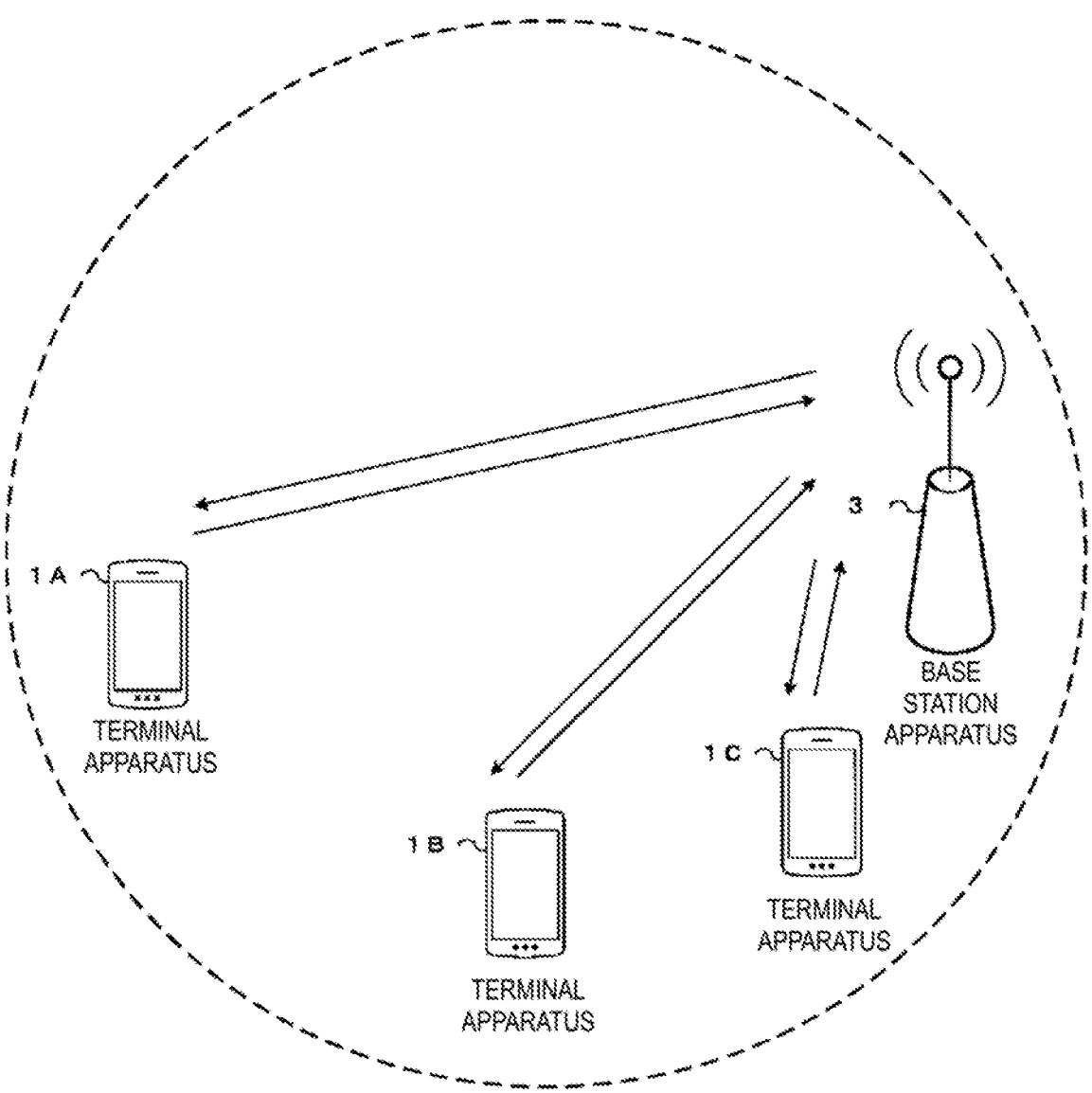
FIG. 1 is a diagram illustrating a concept of a radio communication system according to the present embodiment.

FIG. 1 is a conceptual diagram of a radio communication system according to the present embodiment. In FIG. 1, a radio communication system includes terminal apparatuses 1A to 1C and a base station apparatus 3. Hereinafter, the terminal apparatuses 1A to 1C are each also referred to as a terminal apparatus 1.

The terminal apparatus 1 is also called a user terminal, a mobile station device, a communication terminal, a mobile device, a terminal, User Equipment (UE), and a Mobile Station (MS). The base station apparatus 3 is also referred to as a radio base station apparatus, a base station, a radio base station, a fixed station, a NodeB (NB), an evolved NodeB (eNB), a Base Transceiver Station (BTS), a Base Station (BS), a NR Node B (NR NB), a NNB, a Transmission and Reception Point (TRP).

Referring to FIG. 1, in the radio communication between the terminal apparatus 1 and the base station apparatus 3, Orthogonal Frequency Division Multiplexing (OFDM) including Cyclic Prefix (CP), Single-Carrier Frequency Division Multiplexing (SC-FDM), Discrete Fourier Transform Spread OFDM (DFT-S-OFDM), or Multi-Carrier Code Division Multiplexing (MC-CDM), may be used.

Also, in FIG. 1, in the radio communication between the terminal apparatus 1 and the base station apparatus 3, Universal-Filtered Multi-Carrier (UFMC), Filtered OFDM (F-OFDM), Windowed OFDM, or Filter-Bank Multi-Carrier (FBMC), may be used.

In the present embodiment, the description is made with OFDM symbols using OFDM as a transmission scheme, but a case of using another transmission scheme described above is also included in one aspect of the present invention.

Also, in the radio communication between the terminal apparatus 1 and the base station apparatus 3 in FIG. 1, the above-described transmission scheme that does not use CP, or that has zero padding instead of CP, may be used. Further, CP and zero-padding may be attached to both forward and backward.

Referring to FIG. 1, in the radio communication between the terminal apparatus 1 and the base station apparatus 3, Orthogonal Frequency Division Multiplexing (OFDM) including Cyclic Prefix (CP), Single-Carrier Frequency Division Multiplexing (SC-FDM), Discrete Fourier Transform Spread OFDM (DFT-S-OFDM), or Multi-Carrier Code Division Multiplexing (MC-CDM), may be used.

In FIG. 1, the following physical channels are used for radio communication between the terminal apparatus 1 and the base station apparatus 3.

Physical Broadcast CHannel (PBCH)
Physical Control CHannel (PCCH)
Physical Shared CHannel (PSCH)

The PBCH is used for notifying an important information block (Master Information Block (MIB), Essential Information Block (EIB)) including important system information necessary for the terminal apparatus 1.

PCCH is used for transmitting Uplink Control Information (UCI) in a case of uplink radio communication (radio communication from the terminal apparatus 1 to the base station apparatus 3). Here, the uplink control information may include Channel State Information (CSI) used to indicate a downlink channel state. The uplink control information may include Scheduling Request (SR) used to request an UL-SCH resource.

The uplink control information may include Hybrid Automatic Repeat reQuest ACKnowledgment (HARQ-ACK). The HARQ-ACK may represent HARQ-ACK for downlink data (Transport block, Medium Access Control Protocol Data Unit (MAC PDU), Downlink-Shared Channel (DL-SCH)).

In a case of downlink radio communication (radio communication from the base station apparatus 3 to the terminal apparatus 1), PCCH is used for transmitting Downlink Control Information (DCI). Here, one or more DCIs (may be referred to as DCI formats) are defined for a transmission of downlink control information. In other words, a field for the downlink control information is defined as a DCI and is mapped to information bits.

For example, a DCI including information for indicating whether a signal included in the scheduled PSCH is a downlink radio communication or uplink radio communication, may be defined as a DCI.

For example, a DCI including information for indicating a downlink transmission period included in the scheduled PSCH, may be defined as a DCI.

For example, a DCI including information for indicating an uplink transmission period included in the scheduled PSCH, may be defined as a DCI.

For example, a DCI including information for indicating the timing of transmitting the HARQ-ACK for the scheduled PSCH (for example, the number of symbols from the last symbol included in the PSCH to the HARQ-ACK transmission), may be defined as a DCI.

For example, a DCI including information for indicating a downlink transmission period, a gap, and an uplink transmission period included in the scheduled PSCH, may be defined as a DCI.

For example, a DCI to be used for scheduling one downlink radio communication PSCH in one cell (transmission of one downlink transport block), may be defined as a DCI.

For example, a DCI to be used for scheduling one uplink radio communication PSCH in one cell (transmission of one uplink transport block), may be defined as a DCI.

Here, the DCI includes information related to the scheduling of the PSCH in a case that the PSCH includes an uplink or a downlink. Here, the downlink DCI is also referred to as downlink grant or downlink assignment. Here, the uplink DCI is also referred to as uplink grant or uplink assignment.

PSCH is used for transmitting uplink data (Uplink Shared CHannel (UL-SCH)) or downlink data (Downlink Shared CHannel (DL-SCH)) from Medium Access (Medium Access Control (MAC)). Furthermore, in a case of downlink, the PSCH is also used for transmission of System Information (SI) and Random Access Response (RAR) and the like. In a case of uplink, the PSCH may be used for transmission of HARQ-ACK and/or CSI along with the uplink data. Furthermore, the PSCH may be used to transmit CSI only or HARQ-ACK and CSI only. In other words, the PSCH may be used to transmit the UCI only.

Here, the base station apparatus 3 and the terminal apparatus 1 exchange (transmit and/or receive) signals with each other in their respective higher layers. For example, the base station apparatus 3 and the terminal apparatus 1 may transmit and/or receive, in a Radio Resource Control (RRC) layer, RRC signaling (also referred to as a Radio Resource Control message (RRC message) or Radio Resource Control information (RRC information)). The base station apparatus 3 and the terminal apparatus 1 may transmit and receive a Medium Access Control (MAC) control element in a MAC layer, respectively.

Here, the RRC signaling and/or the MAC control element is also referred to as higher layer signaling.

The PSCH may be used to transmit the RRC signaling and the MAC control element. Here, the RRC signaling transmitted from the base station apparatus 3 may be signaling common to multiple terminal apparatuses 1 in a cell. The RRC signaling transmitted from the base station apparatus 3 may be signaling dedicated to a certain terminal apparatus 1 (also referred to as dedicated signaling). In other words, terminal apparatus-specific (UE-specific) information may be transmitted through signaling dedicated to the certain terminal apparatus 1. The PSCH may be used for transmitting UE capability in the uplink.

Whereas PCCH and PSCH use the same designation for downlink and uplink, different channels may be defined for downlink and uplink.

In FIG. 1, the following downlink physical signals are used for downlink radio communication. Here, the downlink physical signals are not used to transmit the information output from the higher layers but is used by the physical layer.

Synchronization Signal (SS)
Reference Signal (RS)

The synchronization signal is used for the terminal apparatus 1 to take synchronization in the frequency domain and the time domain in the downlink. Here, the synchronization signal may be used by the terminal apparatus 1 for selecting precoding or beam, in a case that precoding or beamforming is performed by the base station apparatus 3.

The Reference Signal is used for the terminal apparatus 1 to perform propagation path compensation of a physical channel. Here, the reference signal may also be used in order for the terminal apparatus 1 to calculate the downlink CSI. In addition, the reference signal may be used for fine synchronization with which numerologies for radio parameters, subcarrier intervals, and the like can be used, or window synchronization of FFT can be performed.

The subframe will be described below. In the present embodiment, it is referred to as a subframe, but it may be referred to as a resource unit, a radio frame, a time section, a time interval, or the like.

FIGS. 2A to 2E each illustrate an example of a subframe (subframe type). In the figure, reference sign D represents a downlink and reference sign U represents an uplink. As shown in the figure, within a certain time period (for example, a minimum time period that must be allocated to one UE in the system) may include one or more of the followings:

downlink part (duration)
gap
uplink part (duration).

Figure 2:
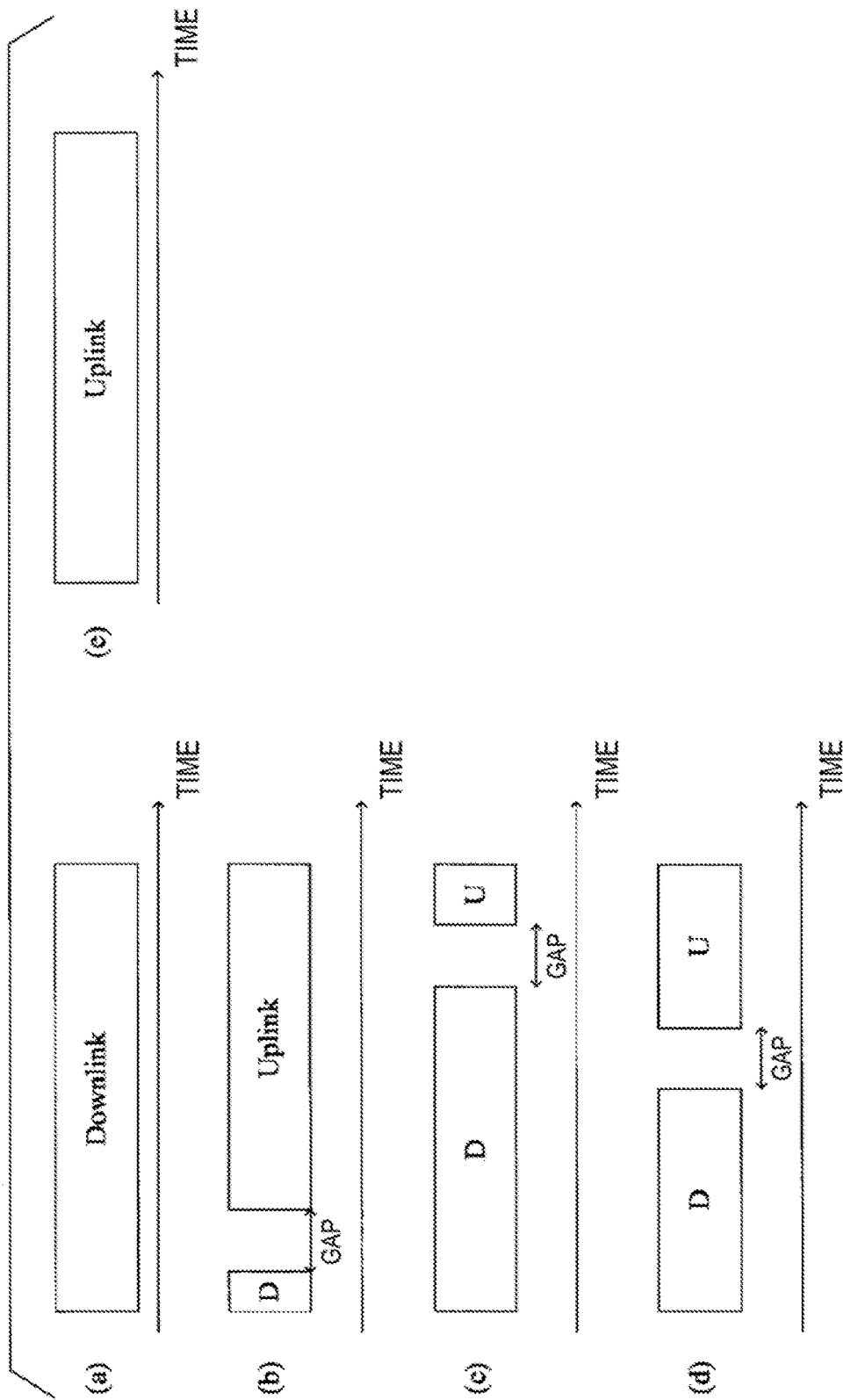
FIGS. 2A to 2E are diagrams, each illustrating a concept of a subframe according to the present embodiment.

FIG. 2A illustrates an example in which an entire time period (For example, it may be referred to such as a minimum unit of time resource that can be allocated to one UE, or a time unit.

It may also be referred to as a time unit in which a plurality of minimum units of time resource are bundled.) is used for downlink transmission. In FIG. 2B, uplink scheduling is performed, for example, through the PCCH in the first time resource, and the uplink signal is transmitted after a gap for the processing delay of the PCCH, the switching time from the downlink to the uplink, and generation of a transmission signal. In FIG. 2C, the first time resource is used for transmitting the downlink PCCH and/or the downlink PSCH, and PSCH or PCCH is transmitted after a gap for the processing delay, the switching time from the downlink to the uplink, and generation of a transmission signal. Here, as one example, the uplink signal may be used for transmission of HARQ-ACK and/or CSI, that is UCI. In FIG. 2D, the first time resource is used for transmitting the downlink PCCH and/or the downlink PSCH, and uplink PSCH and/or PCCH is transmitted after a gap for the processing delay, the switching time from the downlink to the uplink, and generation of a transmission signal. Here, as one example, the uplink signal may be used for transmitting uplink data, that is, UL-SCH. FIG. 2E is an example in which an entire time period is used for uplink transmission (uplink PSCH or PCCH).

The above-described downlink part and uplink part may be constituted by a plurality of OFDM symbols like LTE.

Here, the resource grid may be defined by a plurality of subcarriers, and a plurality of OFDM symbols or a plurality of SC-FDMA symbols. The number of subcarriers constituting one slot may depend on a cell bandwidth. The number of OFDM symbols or SC-FDMA (SC-FDM) symbols constituting one downlink part, or uplink part may be one or more, or two or more. Here, each element within the resource grid is referred to as a resource element. The resource element may be identified by a subcarrier number, and an OFDM symbol number or SC-FDMA symbol number.

Channel coding will be described below.

Code block segmentation is performed to an information bit sequence (which may be referred to as a transport block) transmitted from a higher layer.

It is assumed that the input bit sequence to code block segmentation is $b_k$ (k=0, 1, . . . , B−1, where B is the number of input bits and B>0). In a case that B is greater than the maximum code block size Z, segmentation of the input bit sequence is applied and L bit Cyclic Redundancy Check (CRC) sequence is attached to each code block. The CRC sequence length L is, for example, 16 or 24, and the maximum code block size Z is, for example, 6144 bits or 8192 bits.

In a case that the calculated filler bit number F is not 0, the filler bit is attached to the head of the first block. However, in a case that the number B of input bits is smaller than 40, the filler bit is attached to the head of the code block. The filler bit is set to Null at the input to the encoder.

FIG. 3 illustrates a pseudo code in which the number of code blocks is determined. The length L of the CRC sequence and the number of code blocks, C, are determined by the pseudo code shown in FIG. 3, where A is the length of the CRC sequence and may be different depending on the channel, and B' is the number of bits in a case that a CRC sequence is attached to the number of input bits.

In a case that C is not 0, bits output from code block segmentation are denoted by $c_k$ (k=r 0, r 1, . . . r ($K_r$−1)), where r is the code block number and $K_r$ is the number of bits for the code block number r.

FIGS. 4 and 5 illustrate a pseudo code for determining a segment size and the number of segments in code block segmentation, and a pseudo code for determining a filler bit and a code block size, respectively. FIG. 6 illustrates a table for determining $K_+$ and $K_-$ in FIGS. 4 and 5.

Figure 7:
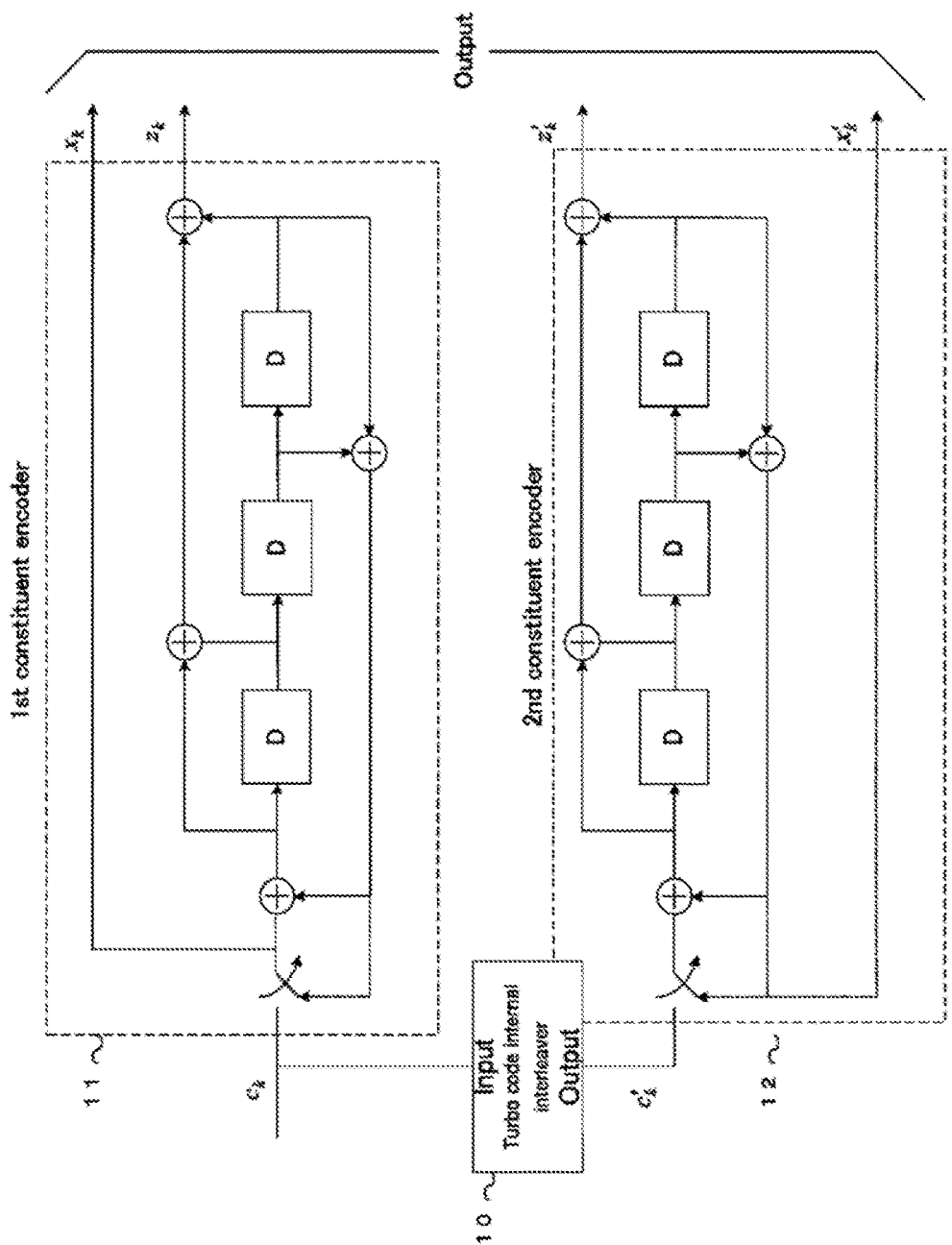
FIG. 7 is a diagram illustrating a configuration of an encoder with an original coding rate of 1/3.

FIG. 7 illustrates a configuration of a turbo encoder having an original coding rate of 1/3. In FIG. 7, the turbo coding scheme is a Parallel Concatenated Convolutional Code (PCCC) having two constituent encoders, each having eight-states (constraint length 4) and a turbo code internal interleaver. In the embodiment, whereas the constituent encoders realized by the convolution operation are connected in parallel, a block code such as LDPC may also be applied, or a configuration may be used that serially concatenate a Serial Concatenated Convolutional Code (SCCC) or the constituent encoder realized by the serially concatenated convolution operation with the block code. In the following embodiments, the coding rate 1/3 in turbo coding is referred to as the original coding rate (mother rate, mother coding rate), and the actual coding rate, determined by the transport block size and the number of codeword bits after rate matching, is referred to as the transmission coding rate.

In FIG. 7, + denotes an exclusive OR, and D denotes a shift register. The initial value of the shift register is 0.

The k-th information bit $c_k$ is input to the first constituent encoder and input to the turbo code internal interleaver 10 as well. In the turbo code internal interleaver 10, an interleaver is performed to interchange the order of the input bits, and $c'_k$ is output. $c'_k$ is input to the second constituent encoder. The information bit is each bit included in a transport block (which is also referred to as a code block group, a code block, or the like), and the information bit may also be referred to as an information source bit, a source bit, or the like.

Turbo code internal interleaver 10 may use random interleaving or block interleaving. Also, a Quadratic Permutation Polynomial (QPP) interleaver may be used. The QPP interleaver is denoted by Equation (1) with respect to the bit length K:

$$\Pi(i)=(f_1 \cdot i + f_2 \cdot i^2) \bmod K \qquad \text{[Equation 1]}$$

where mod is a modulo operation where Π(i) means that the bit to which the i-th bit is input is the Π(i)-th output, and $f_1$ and $f_2$ are the parameters, given in FIG. 5, which is defined by the number of input bits K and of which the values are defined by FIG. 5.

For $c_k$, in the first constituent encoder 11, $z_k$ is output by the logical operation shown in the figure, by using the codeword $x_k$ output as it is and the bit held in the shift register for every time the bit is input. For $c'_k$, in the second constituent encoder 12, $z'_k$ is output by the logical operation shown in the figure, by using the bit held in the shift register for every time the bit is input.

$x'_k$ output from the switch of the first constituent encoder and the second constituent encoder can terminate all of the registers to zero in the state transition of the shift register.

The turbo-coded codeword $d^{(n)}_k$ (n=0, 1, 2) for the k-th information bit is denoted by the following equation respectively, with the assumption that the number of input information bits (code block length) is K (k=0, 1, 2, . . . , K−1).

$$d_k^{(0)} = x_k$$

$$d_k^{(1)} = z_k$$

$$d_k^{(2)} = z'_k \qquad \text{[Equation 2]}$$

The termination bits $d^{(n)}_k$ (n=0, 1, 2 and k=K, K+1, K+2, K+3) are represented by Equations (3) to (6).

$$d_K^{(0)} = x_K$$

$$d_K^{(1)} = z_K$$

$$d_K^{(2)} = x_{K+1} \qquad \text{[Equation 3]}$$

$$d_{K+1}^{(0)} = z_{K+1}$$

$$d_{K+1}^{(1)} = z_{K+2}$$

$$d_{K+1}^{(2)} = z_{K+2} \qquad \text{[Equation 4]}$$

$$d_{K+2}^{(0)} = x'_K$$

$$d_{K+2}^{(1)} = z'_K$$

$$d_{K+2}^{(2)} = x'_{K+1} \qquad \text{[Equation 5]}$$

$$d_{K+3}^{(0)} = z'_{K+1}$$

$$d_{K+3}^{(1)} = x'_{K+2}$$

$$d_{K+3}^{(2)} = z'_{K+2} \qquad \text{[Equation 6]}$$

Figure 8:
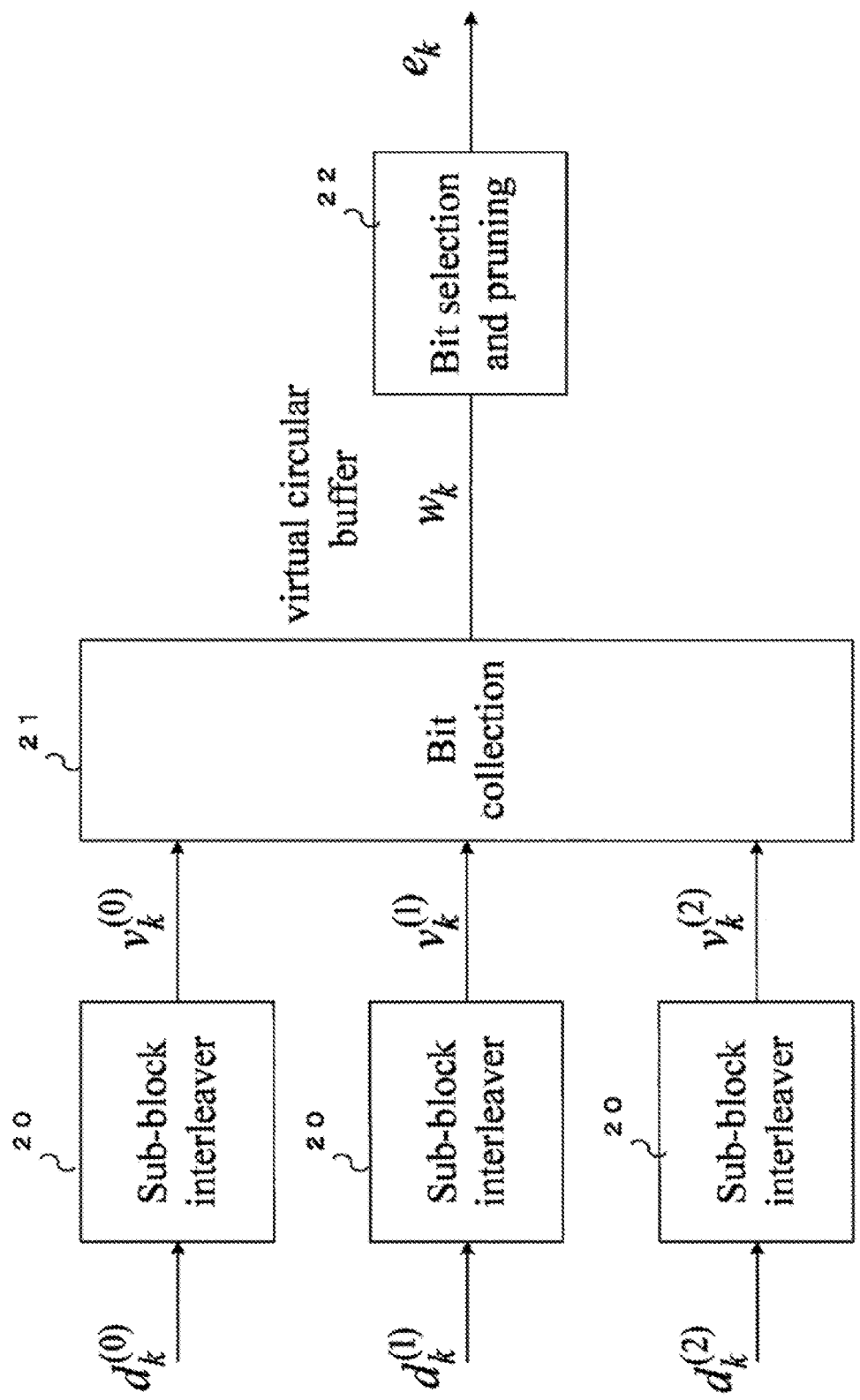
FIG. 8 is a block diagram for performing bit collection and rate matching.

FIG. 8 illustrates an example of a block diagram for rate matching. The order of the turbo-coded codeword $d^{(n)}_k$ is interchanged through the subblock interleaver 20, and $v^{(n)}_k$ is output. For $v^{(n)}_k$, the circular buffer $w_k$ (k=0, 1, . . . , $K_\Pi$) is obtained by the bit collection unit 21. Here, $w_k$ is represented by Equation (7), and the circular buffer length $K_w=3K_\Pi$:

$$w_k = v_k^{(0)}$$

$$w_{K_\Pi + 2k} = v_k^{(1)}$$

$$w_{K_\Pi + 2k+1} = v_k^{(2)} \quad \text{[Equation 7]}$$

where $K_\Pi$ is the number of bits required for the subblock interleaver, R is the minimum value that C×R satisfies K or more, that is $K_\Pi = C \times R$, with the assumption that the subblock interleaver length is C and the number of blocks to which the subblock interleaver is applied is R.

Here, with the assumption that $v_k^{(0)}$ is an organization bit, $v_k^{(1)}$ is a codeword bit from the first constituent encoder, and $v_k^{(2)}$ is a codeword bit from the second constituent encoder, the codewords (code bits) input to the circular buffer are arranged in order with the organization bit being first arranged, and input such that the codeword bit from the first constituent encoder and the codeword bit from the second constituent encoder are alternately arranged.

After that, the codeword $e_k$ is output from the circular buffer by the rate matching 22 according to the value of the redundancy version.

Figure 9:
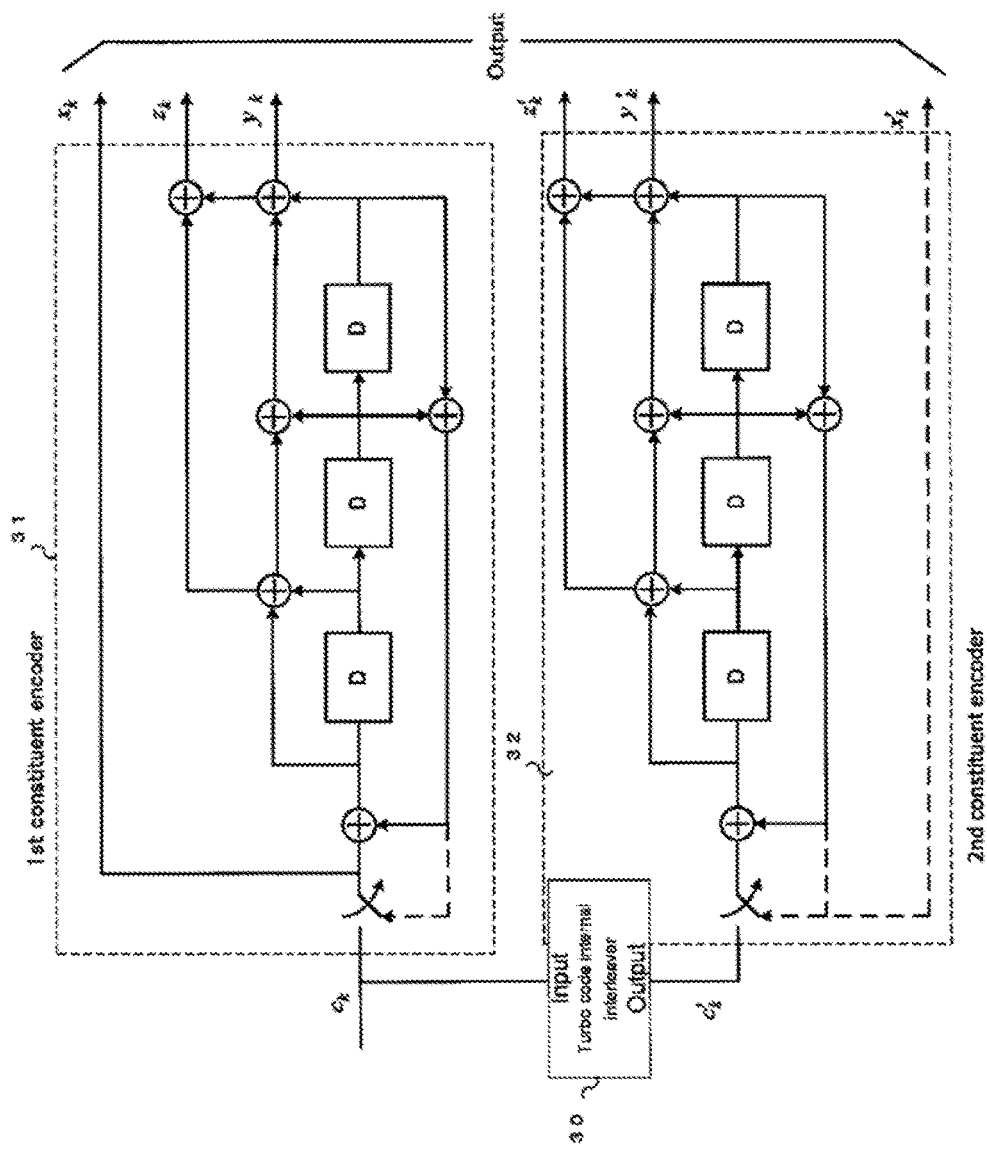
FIG. 9 is a diagram illustrating the configuration of an encoder with an original coding rate of 1/5.

FIG. 9 illustrates a configuration of a turbo encoder having an original coding rate of 1/5. FIG. 9 illustrates a configuration of a Parallel Concatenated Convolutional Code (PCCC) in which component coders of constraint length 4 are concatenated in parallel as one example.

In FIG. 9, + denotes an exclusive OR, and D denotes a shift register. The k-th information bit $c_k$ is input to the first constituent encoder and input to the turbo code internal interleaver 30 as well. In the turbo code internal interleaver 30, an interleaver is performed to interchange the order of the input bits, and $c'_k$ is output. $c'_k$ is input to the second constituent encoder.

The turbo code internal interleaver 30 may be random interleave or block interleave, and may use a Quadratic Permutation Polynomial (QPP) interleaver.

For $c_k$, in the first constituent encoder 31, $z_k$ and $y_k$ are output by the logical operation shown in the figure, by using the codeword $x_k$ output as it is and the bit held in the shift register for every time the bit is input. For $c'_k$, in the second constituent encoder 32, $z'_k$ and $y'_k$ are output by the logical operation shown in the figure, by using the bit held in the shift register for every time the bit is input.

The output $x'_k$ output from the switch of each constituent encoder and the second constituent encoder can terminate all of the registers to zero in the state transition of the shift register.

The turbo-coded codeword $d_k^{(n)}$ (n=0, 1, ..., 4) for the k-th information bit is denoted by Equation (8), with the assumption that the number of input information bits (code block length) is K (k=0, 1, 2, ..., K−1).

$$d_k^{(0)} = x_k$$

$$d_k^{(1)} = z_k$$

$$d_k^{(2)} = y_k$$

$$d_k^{(3)} = z'_k$$

$$d_k^{(4)} = y'_k \quad \text{[Equation 8]}$$

Likewise, the termination bits $d_k^{(n)}$ (n=0, 1, ..., 4 and k=K, K+1, K+2, K+3) are given by code bits output by switching so that all of the shift registers become zero.

Figure 10:
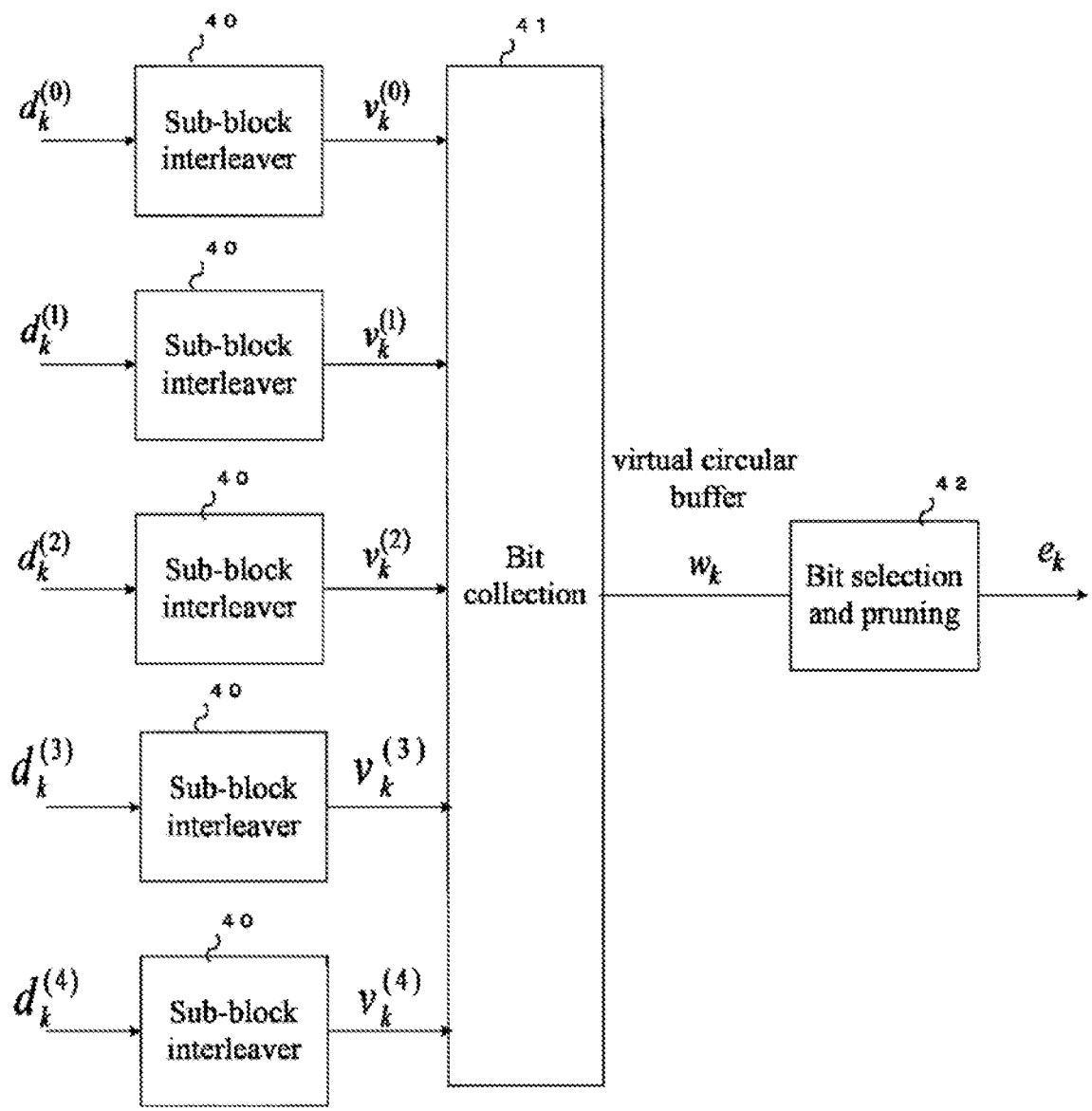
FIG. 10 is a block diagram for performing bit collection and rate matching.

FIG. 10 illustrates an example of a block diagram for rate matching. The order of the turbo-coded codeword $d_k^{(n)}$ is interchanged through the subblock interleaver 40, and $v_k^{(n)}$ is output. For $v_k^{(n)}$, the circular buffer $w_k$ (k=0, 1, ..., $K_\Pi$) is obtained by the bit collection unit 41. Here, $w_k$ is denoted by Equation (9), and the circular buffer length $Kw=5 K_\Pi$:

$$w_k = v_k^{(0)}$$

$$w_{K_\Pi + 2k} = v_k^{(1)}$$

$$w_{K_\Pi + 2k+1} = v_k^{(2)}$$

$$w_{3K_\Pi + 2k} = v_k^{(2)}$$

$$w_{3K_\Pi + 2k+1} = v_k^{(4)} \quad \text{[Equation 9]}$$

where $K_\Pi$ is the number of bits required for the subblock interleaver, R is the minimum value that C×R satisfies K or more, that is $K_\Pi = C \times R$, assuming that the subblock interleaver length is C and the number of blocks to which the subblock interleaver is applied is R.

Here, assuming that $v_k^{(0)}$ is an organization bit, $v_k^{(1)}$ and $v_k^{(2)}$ are codeword bits from the first constituent encoder, and $v_k^{(3)}$ and $v_k^{(4)}$ are a codeword bits from the second constituent encoder, the codewords (code bits) input to the circular buffer are arranged in order with the organization bits first, and $v_k^{(2)}$ and $v_k^{(4)}$ are input alternately, so that the codeword bits from the first constituent encoder and the codeword bits from the second constituent encoder, $v_k^{(1)}$ and $v_k^{(3)}$, are alternately arranged.

After that, the codeword $e_k$ is output from the circular buffer by the rate matching 42 according to the value of the redundancy version.

In the present embodiment, the original coding rate of 1/3 and the original coding rate of 1/5 have been described respectively, however, they may be switched according to the original coding rate of the codeword to be transmitted, or only channel coding of the original coding rate of 1/5 may be used.

Further, the base station apparatus 3 may signal which original coding rate is to be used for coding, to the terminal apparatus 1. For example, the base station apparatus 3 may transmit the information used to indicate that coding is being performed by using the original coding rate 1/3. Also, the base station apparatus 3 may transmit the information used to indicate that coding is being performed by using the original coding rate 1/5. In other words, the original coding rate that is being used for coding may be given, based on the information transmitted by the base station apparatus 3. Also, the coding scheme, among a plurality of coding scheme (such as turbo code, convolutional code, LDPC, polar code, Reed-Solomon code, outer erasure code), to be applied may be signaled. Further, the coding scheme that is applied to the transport block may be specified by specifications or the like. For example, the first coding scheme may be applied to the first transport block and the second coding scheme may be applied to the second transport block.

A method of coding a transport block with respect to the number of decodable OFDM symbols or the number of decodable SC-FDMA symbols will be described below. (Scaling the transport block size according to the number of symbols in the symbol group)

Figure 11:
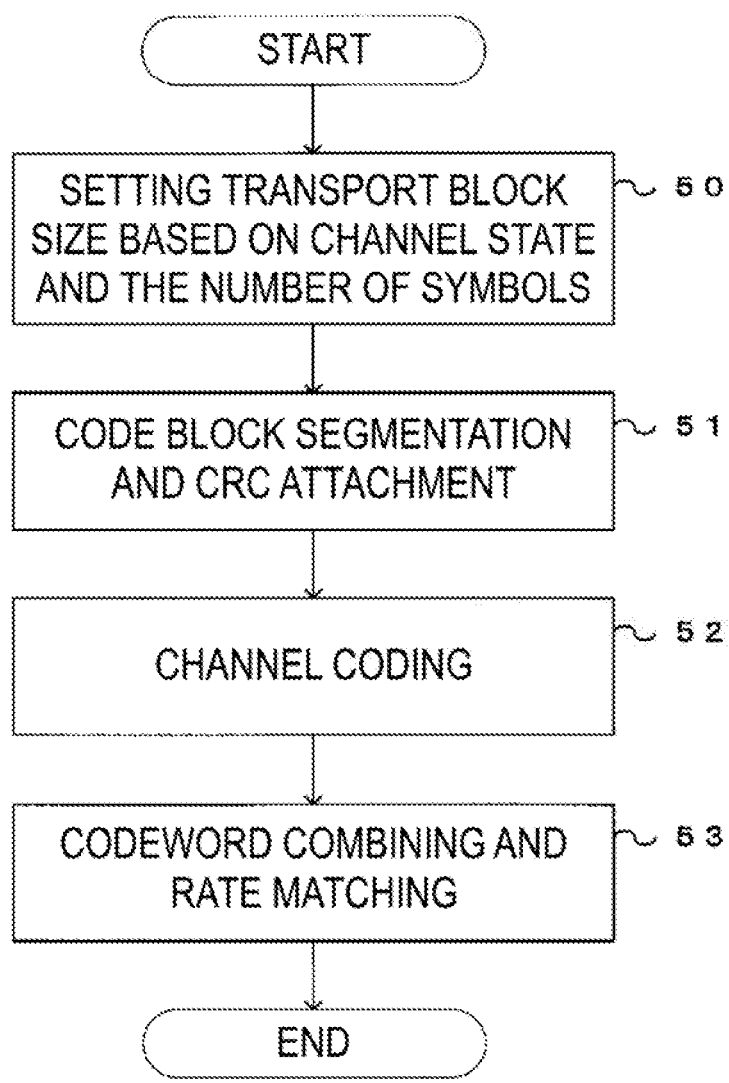
FIG. 11 is an example of a flow for performing a channel coding.

FIG. 11 illustrates a flowchart in a case that the number of OFDM symbols or the number of SC-FDMA symbols included in the downlink part and the uplink part, is X.

First, in step 50, the transport block size is determined based on the channel state (for example, the CSI information measured by the terminal apparatus in a case of downlink, the uplink channel state measured by the base station apparatus based on the uplink sounding signal in a case of uplink), and the number of symbols included in the downlink part or the uplink part used for transmitting the PSCH.

For example, in the downlink PSCH, in a case that the CQI included in the CSI reported from the terminal apparatus is 16 QAM and the utilization efficiency is 3 (which is the number of bits that can be transmitted per one hertz), the transmission coding rate multiplied by 1024 is 768, and the transmission coding rate r=3/4. At this time, assuming that the number of modulation symbols that can be mapped in the X symbol is Y, the transport block size to which the transmittable CRC is attached is represented by Equation (10):

$$B'=\text{floor}(MYr) \quad \text{[Equation 10]}$$

where floor(x) is a floor function, and is the largest integer that is less than or equal to x, B' is the number of information bits before channel coding, M is the number of bits that can be transmitted per one modulation symbol, and r is a transmission coding rate. The value of M varies depending on the modulation scheme, and for example, M=1, M=2, M=4, M=6, M=8, M=10 correspond to BPSK, QPSK, 16 QAM, 64 QAM, 256 QAM, 1024 QAM, respectively.

At this time, in a case that the number of transport blocks is determined, B' may be determined as the value B that is closest to B' from the predefined table, or the value B that is closest to B' defined by the number X of symbols. Further, the transport block size B may be determined after calculating the number of code blocks from B' in advance, or B' may be used as it is for code block segmentation. It may, or may not, be assumed that the CRC bit is included in the B' described above.

For example, in a case of Y=1024, M=4, r=3/4, B' is 3072 and B is determined from 3072 (3070, for example), then the processing proceeds to, for example, the step of the code block segmentation described above.

From the determined value B, code block segmentation and attachment of CRC to each code block are performed in step 51, and channel coding is performed in step 52. Subsequently, in step 51, combining of bit sequences such as subblock interleaving and rate-matching are performed.

Here, the determination of the transport block size according to the present embodiment may be either a turbo code or a Low Density Parity Check code (LDPC).

The transport block size according to the present embodiment may be determined by the Mediation Access Control (MAC) layer based on the number X of symbols.

(Coding the Transport Block for Each Symbol Group)

Another method of determining a code block according to the present embodiment will be described below. Whereas the transport block size is changed in the above-described example, the code block size is changed based on the number X of OFDM symbols or the number X of SC-FDMA symbols in the following method.

Figure 12:
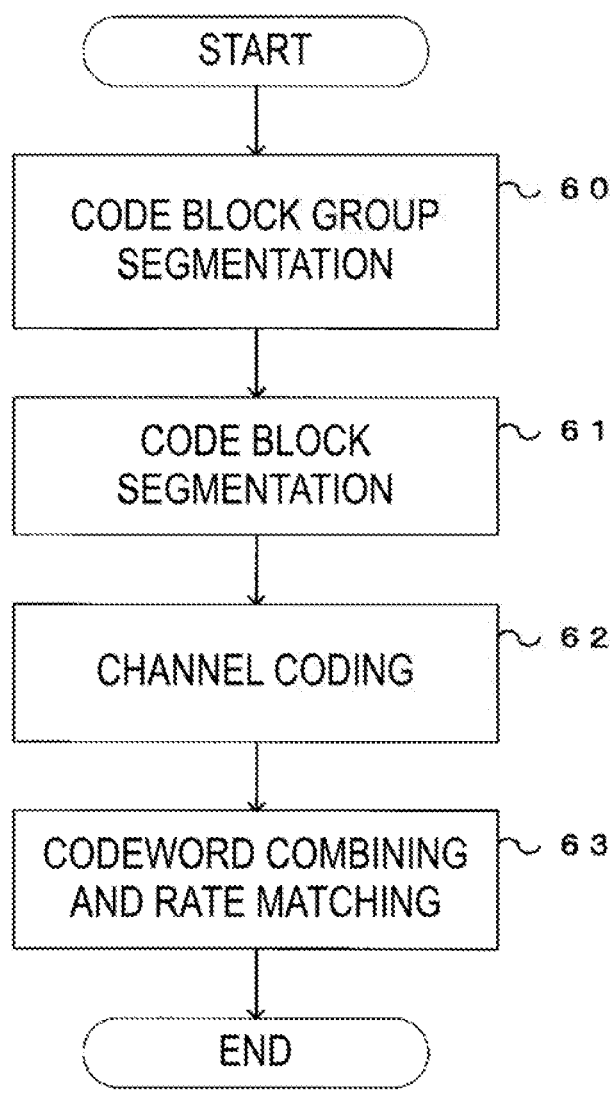
FIG. 12 is an example of a flow for performing a channel coding.

FIG. 12 illustrates an example of a flowchart of the determination method. In step 60, the transmission apparatus (base station apparatus or terminal apparatus) determines the number of bits (size) for code block group segmentation from the number of modulation symbols (or the number of resource elements) that can be mapped to X symbol. For example, based on the number of modulation symbols (number of resource elements) corresponding to X symbols among the symbols (N symbols) to be used for transmitting the transport block, the number of bits (size) for code block group segmentation with respect to the transport block, may be given. That is, the transport block may be divided into the given number of bits (size) by code block group segmentation.

Here, the X symbols (X is the number of symbols) may be defined in advance by a specification or the like. Also, the X symbols may be given based on the information transmitted by the base station apparatus 3. For example, the number of X symbols may be 1, 2, 4, and/or 7.

For example, in the downlink PSCH, in a case that the CQI included in the CSI reported from the terminal apparatus is 16 QAM and the utilization efficiency is 3 (which is the number of bits that can be transmitted per one hertz), the transmission coding rate multiplied by 1024 is 768, and the transmission coding rate r=3/4. At this time, assuming that the number of modulation symbols that can be mapped in the X symbol is Y, the number of transmittable bits B" before channel coding is denoted by Equation (11):

$$B''=\text{floor}(MYr) \quad \text{[Equation 11]}$$

where floor(x) is a floor function, and is the largest integer that is less than or equal to x. B" obtained in this way is treated as the number of bits of one code block group. For example, in a case that the transport block size is 12288 bits and B" is 7000 bits, code block segmentation is performed in step 61, by using 7000 bits and 5288 bits as units for code block division, instead of creating two code blocks of 6144 bits for example. That is, in this example, the transport block size is 12288 bits, and the number of bits for code block group segmentation is 7000 bits and 5288 bits. That is, the number of code block groups is two. Further, code block segmentation is applied to each of 7000 bit code block group and 5288 bit code block group.

Subsequently, channel coding is performed in step 62, and codeword combining and rate matching are performed in step 63.

Figure 13:
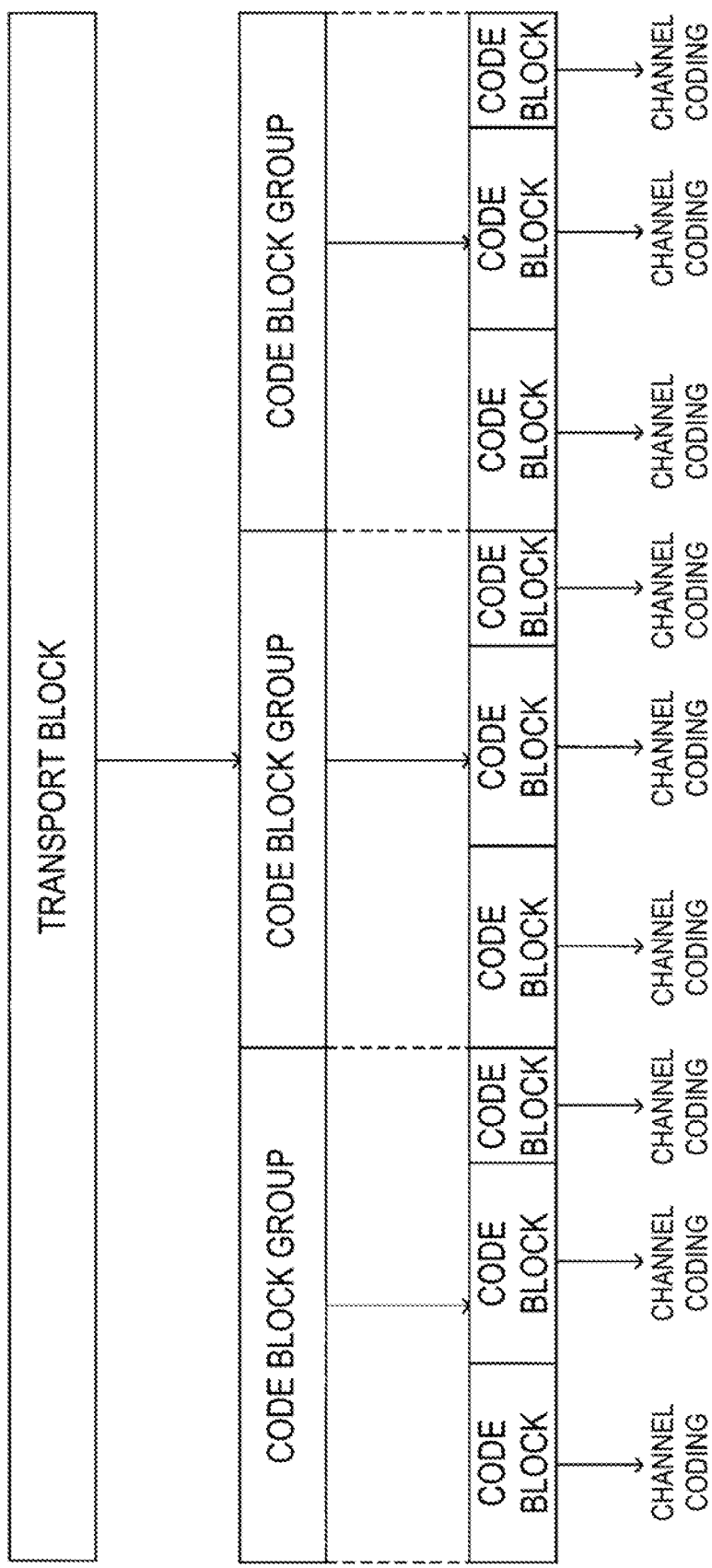
FIG. 13 is a diagram illustrating a concept of code block segmentation.

FIG. 13 illustrates the concept of applying codeword segmentation from the transport block according to the embodiment.

A CRC is attached to a transport block, and the transport block is divided into a plurality of code block groups (B" bits) based on the number of resource elements included in the X symbol.

Code block segmentation is applied to each of code block groups.

In the code block segmentation, the size of the code block is determined such that the segment size becomes a predetermined value.

Figure 14:
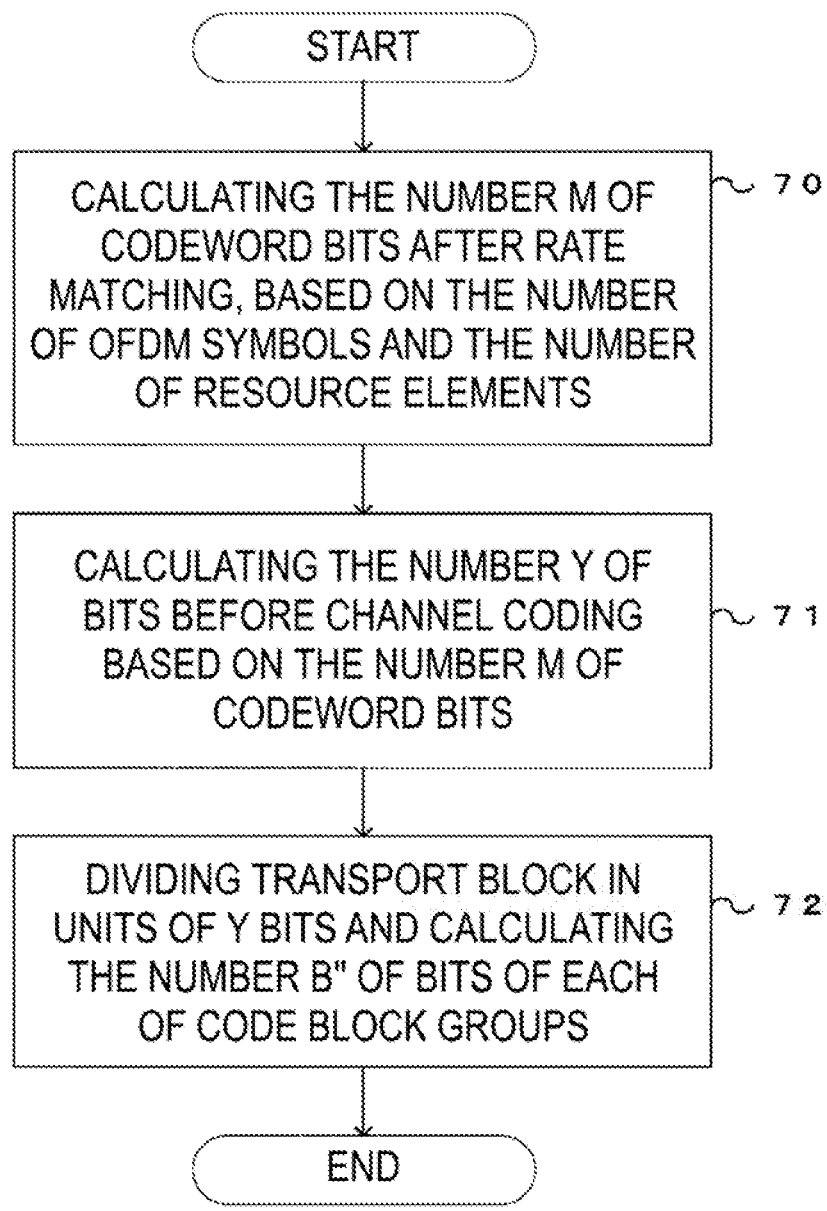
FIG. 14 is an example of a flow for performing a channel coding.

FIG. 14 illustrates an example of a flow for code block group segmentation in step 60.

First, in step 70, the number M of codeword bits (the number of bits after channel coding) is calculated from the number X of symbols and/or the number of resource elements. For example, assuming the number of resource elements included in the X-OFDM symbols or the X-SC-FDMA symbols is Y, the number Q of transmittable bits in one modulation symbol may be used to denote M=Y×Q.

Next, in step 71, the number of bits of the code block group for which the number of codeword bits after rate matching becomes M, is calculated. For example, assuming that the transmission coding rate used for transmission such as CSI reporting or sounding is r, the number B" of bits included in the code block group is represented as B"=floor(Mr), where floor(x) is a floor function, and is the largest integer that is less than or equal to x.

Finally, the transport block size is divided into code block groups in step 72. Assuming that the number of bits included in the 1-th code block group is $K_l$ and the number of code block groups is $C_l$, they are denoted by Equation (12):

$$C_l = \text{ceil}(A/M) \qquad \text{[Equation 12]}$$
$$B'' = \begin{cases} \text{floor}(Mr) & l \neq C_l \\ A - (C_l - 1)\text{floor}(Mr) & l = C_l \end{cases}$$

where ceil(x) is a ceiling function, and is the smallest integer that is greater than or equal to x, floor(x) is a floor function, and is the largest integer that is less than or equal to x, and a is transport block size. Here, the remainder obtained by dividing the transport block size by the floor (Mr) bit is regarded as one code block group for the fraction, but other processing of fraction may be used. For example, in a case that the transport block is divided for each floor(Mr) bit until the remaining bits become between the floor(Mr) bit and 2×floor(Mr), the transport block segmentation may be performed by causing the remaining transport block to be divided in two.

FIGS. 15 and 16 respectively illustrate a pseudo code for determining segment size and number of segments in code block segmentation in step 61, and a pseudo code for determining filler bits and code block size.

FIGS. 15 and 16 illustrate a case of using the turbo code as one example, and the difference from FIG. 4 is that the value is determined by B" in place of B'.

First, the first segmentation size K. is set to the smallest value among the values of K in FIG. 5, the values of K satisfying a relationship in which the value of the number of code blocks×K is B" or more.

In a case that the number of code blocks, C, is 1, the number of code block sizes of length $K_+$ is set to $C_+=1$, and $K_-=0$ and $C_-=0$.

In a case that the number of code blocks, C, is greater than 1, the second segmentation size $K_+$ is set to the greatest value that is smaller than $K_+$ among Ks in FIG. 5.

After that, segment sizes $C_-$ and $C_+$ are determined by the equation in FIG. 14. Finally, the number of the filler bits is determined, and the size $K_r$ of the r-th code block is determined.

In a case of LDPC, the size of rows or columns of a check matrix or a generator matrix of LDPC, which is predefined or defined by a code block or a transport block size, may be set as a code block size $K_r$. In the case of LDPC, processing such as determination of the number of filler bits may be omitted.

CRC (CRC parity bit) may be attached (granted) to the code block group. The CRC may not be attached to the code block group. The HARQ bit may be reported for each code block group. The HARQ bit may be reported for each transport block.

In a case that the number of code blocks, C, is greater than 1, the second segmentation size $K_+$ is set to the greatest value that is smaller than $K_+$ among Ks in FIG. 5.

After that, segment sizes $C_-$ and $C_+$ are determined by the equation in FIG. 14. Finally, the number of the filler bits is determined, and the size $K_r$ of the r-th code block is determined.

In a case of LDPC, the size of rows or columns of a check matrix or a generator matrix of LDPC, which is predefined or defined by a code block or a transport block size, may be set as a code block size $K_r$. In the case of LDPC, processing such as determination of the number of filler bits may be omitted.

As another method of calculating B", B" is determined by dividing the transport block transmitted (supplied) from the higher layer by a unit of the number X of OFDM symbols or the number X of SC-FDMA symbols X, the number X being a unit for decoding.

Specifically, in step 70, B" is denoted by Equation (13) for example, where the number of allocated OFDM symbols or the number of allocated SC-FDMA symbols is N, the number of OFDM symbols or the number of SC-FDMA symbols, as a unit for decoding, is X, and the transport block size is T.

$$B'' = \begin{cases} \text{floor}(T/(N/X)) + 1 & l \leq \text{mod}(T, C_l) \\ \text{floor}(T/(N/X)) & \text{mod}(T, C_l) < l \leq C_l \end{cases} \quad \text{[Equation 13]}$$

However, mod (A, B) is a remainder obtained by dividing A by B. Here, the calculation is performed by a method of dividing such that the difference in the number of bits between code block groups is minimized, but other methods of dividing may be used. Further, the number X of decodable OFDM symbols or the number X of decodable SC-FDM symbol X is smaller than the number N of allocated OFDM symbols or the number N of allocated SC-FDM symbols.

In a case of LDPC, the generator matrix or the check matrix may be determined or selected based on B" or code block length.

One aspect of the present embodiment may be operated in a carrier aggregation or a dual connectivity of a Radio Access Technology (RAT) such as LTE and LTE-A/LTE-A Pro. At this time, one aspect of the present embodiment may be used in some or all of the cells, cell groups, carriers, or carrier groups, such as a Primary Cell (PCell), a Secondary Cell (SCell), a Primary Secondary Cell (PSCell), a Master Cell Group (MCG), a Secondary Cell Group (SCG), or the like. It may also be used in stand-alone operating independently.

The transport block according to the present embodiment can also be extended to be assigned to a plurality of subframes and time units. Further, the number X of OFDM symbols or the number X of the SC-FDM symbols may be greater than the number N of allocated OFDM symbols.

Configurations of apparatuses according to the present embodiment will be described below. Here, an example is described, in which CP-OFDM is applied as the downlink radio transmission scheme and CP DFTS-OFDM (SC-FDM) is applied as the uplink radio transmission scheme.

Figure 17:
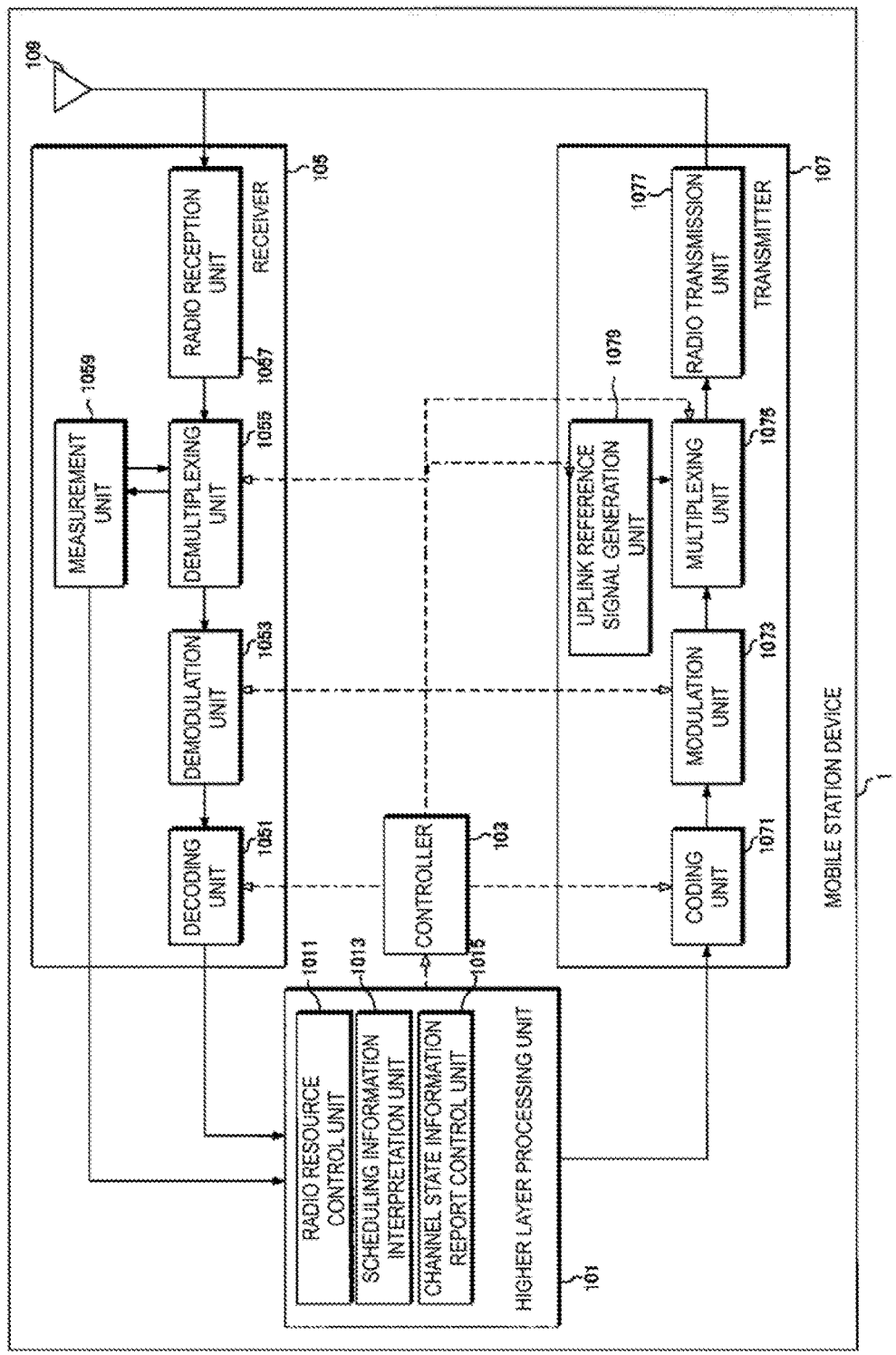
FIG. 17 is a schematic block diagram illustrating a configuration of a terminal apparatus 1 according to the present embodiment.

FIG. 17 is a schematic block diagram illustrating a configuration of the terminal apparatus 1 according to the present embodiment. As illustrated in FIG. 9, the terminal apparatus 1 is configured to include a higher layer processing unit 101, a controller 103, a receiver 105, a transmitter 107, and a transmit and/or receive antenna 109. Furthermore, the higher layer processing unit 101 is configured to include a radio resource control unit 1011, a scheduling information interpretation unit 1013, and a Channel State Information (CSI) report control unit 1015. Furthermore, the receiver 105 is configured to include a decoding unit 1051, a demodulation unit 1053, a demultiplexing unit 1055, a radio reception unit 1057, and a measurement unit 1059. The transmitter 107 is configured to include a coding unit 1071, a modulation unit 1073, a multiplexing unit 1075, a radio transmission unit 1077, and an uplink reference signal generation unit 1079.

The higher layer processing unit 101 outputs the uplink data (the transport block) generated by a user operation or the like, to the transmitter 107. Furthermore, the higher layer processing unit 101 performs processing of the Medium Access Control (MAC) layer, the Packet Data Convergence Protocol (PDCP) layer, the Radio Link Control (RLC) layer, and the Radio Resource Control (RRC) layer.

The radio resource control unit 1011 included in the higher layer processing unit 101 manages various pieces of configuration information of the terminal apparatus 1 itself. Furthermore, the radio resource control unit 1011 generates information to be mapped to each uplink channel, and outputs the generated information to the transmitter 107.

The scheduling information interpretation unit 1013 included in the higher layer processing unit 101 interprets the DCI (scheduling information) received through the receiver 105, generates control information for control of the receiver 105 and the transmitter 107, in accordance with a result of interpreting the DCI, and outputs the generated control information to the controller 103.

The CSI report control unit 1015 indicates to the measurement unit 1059 an operation of deriving Channel State Information (RI/PMI/CQI/CRI) relating to the CSI reference resource. The CSI report control unit 1015 indicates to the transmitter 107 an operation of transmitting RI/PMI/CQI/CRI. The CSI report control unit 1015 sets a configuration that is used when the measurement unit 1059 calculates CQI.

In accordance with the control information from the higher layer processing unit 101, the controller 103 generates a control signal for control of the receiver 105 and the transmitter 107. The controller 103 outputs the generated control signal to the receiver 105 and the transmitter 107 to control the receiver 105 and the transmitter 107.

In accordance with the control signal input from the controller 103, the receiver 105 demultiplexes, demodulates, and decodes a reception signal received from the base station apparatus 3 through the transmit and/or receive antenna 109, and outputs the decoded information to the higher layer processing unit 101.

The radio reception unit 1057 converts (down-converts) a downlink signal received through the transmit and/or receive antenna 109 into a signal of an intermediate frequency, removes unnecessary frequency components, controls an amplification level in such a manner as to suitably maintain a signal level, performs orthogonal demodulation on the basis of an in-phase component and an orthogonal component of the received signal, and converts the resulting orthogonally-demodulated analog signal into a digital signal. The radio reception unit 1057 removes a portion corresponding to a Guard Interval (GI) from the digital signal resulting from the conversion, performs Fast Fourier Transform (FFT) on the signal from which the Guard Interval has been removed, and extracts a signal in the frequency domain.

The demultiplexing unit 1055 demultiplexes the extracted signal into the downlink PCCH, PSCH, and the downlink reference signal, respectively. Furthermore, the demultiplexing unit 1055 makes a compensation of propagation channels including PCCH and PSCH from the propagation channel estimate input from the measurement unit 1059. Furthermore, the demultiplexing unit 1055 outputs the downlink reference signal resulting from the demultiplexing, to the measurement unit 1059.

The demodulation unit 1053 demodulates the downlink PCCH and outputs a result of the demodulation to the decoding unit 1051. The decoding unit 1051 attempts to decode the PCCH. In a case of succeeding in the decoding, the decoding unit 1051 outputs downlink control information resulting from the decoding and an RNTI to which the downlink control information corresponds, to the higher layer processing unit 101.

The demodulation unit 1053 demodulates the PSCH in compliance with a modulation scheme notified with the downlink grant, such as Quadrature Phase Shift Keying (QPSK), 16 Quadrature Amplitude Modulation (QAM), or 64 QAM, 256 QAM, and outputs a result of the demodulation to the decoding unit 1051. The decoding unit 1051 decodes the downlink data in accordance with information of a transmission or an original coding rate notified with the downlink control information, and outputs, to the higher layer processing unit 101, the downlink data (the transport block) resulting from the decoding.

The measurement unit 1059 performs downlink path loss measurement, channel measurement, and/or interference measurement from the downlink reference signal input from the demultiplexing unit 1055. The measurement unit 1059 outputs, to the higher layer processing unit 101, the measurement result and CSI calculated based on the measurement result. Furthermore, the measurement unit 1059 calculates a downlink channel estimate from the downlink reference signal and outputs the calculated downlink channel estimate to the demultiplexing unit 1055.

The transmitter 107 generates the uplink reference signal in accordance with the control signal input from the controller 103, codes and modulates the uplink data (the transport block) input from the higher layer processing unit 101, multiplexes PUCCH, PUSCH, and the generated uplink reference signal, and transmits a result of the multiplexing to the base station apparatus 3 through the transmit and/or receive antenna 109.

The coding unit 1071 performs coding on the Uplink Control Information and the uplink data input from the higher layer processing unit 101. The modulation unit 1073 modulates the coded bits input from the coding unit 1071, in compliance with the modulation scheme such as BPSK, QPSK, 16 QAM, or 64 QAM, 256 QAM.

The uplink reference signal generation unit 1079 generates a sequence acquired according to a rule (formula) prescribed in advance, based on a physical cell identifier (also referred to as a Physical Cell Identity (PCI), a cell ID, or the like) for identifying the base station apparatus 3, a bandwidth to which the uplink reference signal is mapped, a cyclic shift notified with the uplink grant, a parameter value for generation of a DMRS sequence, and the like.

On the basis of the information used for the scheduling of PUSCH, the multiplexing unit 1075 determines the number of PUSCH layers to be spatial-multiplexed, maps multiple pieces of uplink data to be transmitted on the same PUSCH to multiple layers through Multiple Input Multiple Output Spatial Multiplexing (MIMO SM), and performs precoding on the layers.

In accordance with the control signal input from the controller 103, the multiplexing unit 1075 performs Discrete Fourier Transform (DFT) on modulation symbols of PSCH. Furthermore, the multiplexing unit 1075 multiplexes PCCH and PSCH signals and the generated uplink reference signal for each transmit antenna port. To be more specific, the multiplexing unit 1075 maps the PCCH and PSCH signals and the generated uplink reference signal to the resource elements for each transmit antenna port.

The radio transmission unit 1077 performs Inverse Fast Fourier Transform (IFFT) on a signal resulting from the multiplexing, performs modulation in compliance with an SC-FDM scheme, attaches the Guard Interval to the SC-FDM-modulated SC-FDM symbol, generates a baseband digital signal, converts the baseband digital signal into an analog signal, generates an in-phase component and an orthogonal component of an intermediate frequency from the analog signal, removes frequency components unnecessary for the intermediate frequency band, converts (up-converts) the signal of the intermediate frequency into a signal of a high frequency, removes unnecessary frequency components, performs power amplification, and outputs a final result to the transmit and/or receive antenna 109 for transmission.

Figure 18:
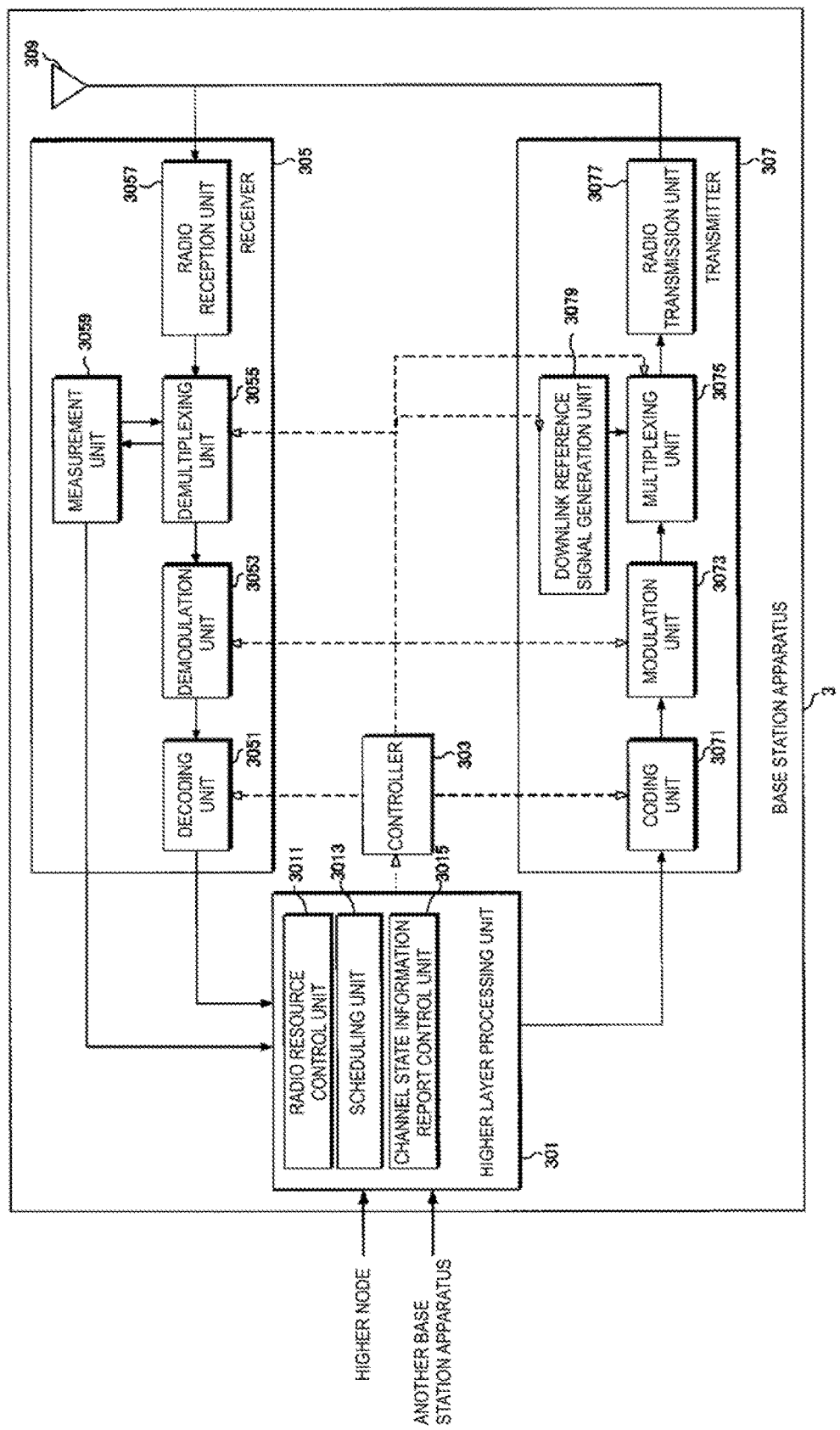
FIG. 18 is a schematic block diagram illustrating a configuration of a base station apparatus 3 according to the present embodiment.

FIG. 18 is a schematic block diagram illustrating a configuration of the base station apparatus 3 in the present embodiment. As is illustrated, the base station apparatus 3 is configured to include a higher layer processing unit 301, a controller 303, a receiver 305, a transmitter 307, and a transmit and/or receive antenna 309. The higher layer processing unit 301 is configured to include a radio resource control unit 3011, a scheduling unit 3013, and a CSI report control unit 3015. The receiver 305 is configured to include a decoding unit 3051, a demodulation unit 3053, a demultiplexing unit 3055, a radio reception unit 3057, and a measurement unit 3059. The transmitter 307 is configured to include a coding unit 3071, a modulation unit 3073, a multiplexing unit 3075, a radio transmission unit 3077, and a downlink reference signal generation unit 3079.

The higher layer processing unit 301 performs processing of the Medium Access Control (MAC) layer, the Packet Data Convergence Protocol (PDCP) layer, the Radio Link Control (RLC) layer, and the Radio Resource Control (RRC) layer. Furthermore, the higher layer processing unit 301 generates control information for control of the receiver 305 and the transmitter 307, and outputs the generated control information to the controller 303.

The radio resource control unit 3011 included in the higher layer processing unit 301 generates, or acquires from a higher node, the downlink data (the transport block) mapped to the downlink PSCH, system information, the RRC message, the MAC Control Element (CE), and the like, and outputs a result of the generation or the acquirement to the transmitter 307. Furthermore, the radio resource control unit 3011 manages various configuration information for each of the terminal apparatuses 1.

The scheduling unit 3013 included in the higher layer processing unit 301 determines a frequency and a subframe to which the physical channels (PSCH) are allocated, the transmission coding rate and modulation scheme for the physical channels (PSCH), the transmit power, and the like, from the received CSI and from the channel estimate, channel quality, or the like input from the measurement unit 3059. The scheduling unit 3013 generates the control information in order to control the receiver 305 and the transmitter 307 in accordance with a result of the scheduling, and outputs the generated information to the controller 303. The scheduling unit 3013 generates the information (e.g., the DCI format) to be used for scheduling the physical channels (PSCH), based on the result of the scheduling.

The CSI report control unit 3015 included in the higher layer processing unit 301 controls a CSI report that is made by the terminal apparatus 1. The CSI report control unit 3015 transmits information that is assumed in order for the terminal apparatus 1 to derive RI/PMI/CQI in the CSI reference resource and that shows various configurations, to the terminal apparatus 1 through the transmitter 307.

The controller 303 generates, based on the control information from the higher layer processing unit 301, a control signal for controlling the receiver 305 and the transmitter 307. The controller 303 outputs the generated control signal to the receiver 305 and the transmitter 307 to control the receiver 305 and the transmitter 307.

In accordance with the control signal input from the controller 303, the receiver 305 demultiplexes, demodulates, and decodes the reception signal received from the terminal apparatus 1 through the transmit and/or receive antenna 309, and outputs information resulting from the decoding to the higher layer processing unit 301. The radio reception unit 3057 converts (down-converts) an uplink signal received through the transmit and/or receive antenna 309 into a signal of an intermediate frequency, removes unnecessary frequency components, controls the amplification level in such a manner as to suitably maintain a signal level, performs orthogonal demodulation based on an in-phase component and an orthogonal component of the received signal, and converts the resulting orthogonally-demodulated analog signal into a digital signal.

The radio reception unit 3057 removes a portion corresponding to the Guard Interval (GI) from the digital signal resulting from the conversion. The radio reception unit 3057 performs Fast Fourier Transform (FFT) on the signal from which the Guard Interval has been removed, extracts a signal in the frequency domain, and outputs the resulting signal to the demultiplexing unit 3055.

The demultiplexing unit 1055 demultiplexes the signal input from the radio reception unit 3057 into PCCH, PSCH, and the signal such as the uplink reference signal. The demultiplexing is performed based on radio resource allocation information that is determined in advance by the base station apparatus 3 using the radio resource control unit 3011 and that is included in the uplink grant notified to each of the terminal apparatuses 1. Furthermore, the demultiplexing unit 3055 makes a compensation of channels including PCCH and PSCH from the channel estimate input from the measurement unit 3059. Furthermore, the demultiplexing unit 3055 outputs an uplink reference signal resulting from the demultiplexing, to the measurement unit 3059.

The demodulation unit 3053 performs Inverse Discrete Fourier Transform (IDFT) on PSCH, acquires modulation symbols, and performs reception signal demodulation, that is, demodulates each of the modulation symbols on PCCH and PSCH, in compliance with the modulation scheme prescribed in advance, such as Binary Phase Shift Keying (BPSK), QPSK, 16 QAM, 64 QAM, or 256 QAM, or in compliance with the modulation scheme that the base station apparatus 3 itself notifies in advance each of the terminal apparatuses 1 with the uplink grant. The demodulation unit 3053 demultiplexes the modulation symbols of multiple pieces of uplink data transmitted on the same PSCH with the MIMO SM, based on the number of spatial-multiplexed sequences notified in advance with the uplink grant to each of the terminal apparatuses 1 and information designating the precoding to be performed on the sequences.

The decoding unit 3051 decodes the coded bits of PCCH and PSCH, which have been demodulated, in compliance with a coding scheme predetermined in advance, with the transmission or original coding rate that is predetermined in advance or notified in advance with the uplink grant to the terminal apparatus 1 by the base station apparatus 3 itself, and outputs the decoded uplink data and uplink control information to the higher layer processing unit 101. In a case where the PSCH is re-transmitted, the decoding unit 3051 performs the decoding with the coded bits input from the higher layer processing unit 301 and retained in an HARQ buffer, and the demodulated coded bits. The measurement unit 309 measures the channel estimate, the channel quality, and the like, based on the uplink reference signal input from the demultiplexing unit 3055, and outputs a result of the measurement to the demultiplexing unit 3055 and the higher layer processing unit 301.

The transmitter 307 generates the downlink reference signal in accordance with the control signal input from the controller 303, codes and modulates the downlink control information, and the downlink data that are input from the higher layer processing unit 301, multiplexes PCCH, PSCH, and the downlink reference signal or assign distinct radio resources to them, and transmits a result of the multiplexing to the terminal apparatus 1 through the transmit and/or receive antenna 309.

The coding unit 3071 performs coding on the Downlink Control Information and the downlink data input from the higher layer processing unit 301. The modulation unit 3073 modulates the coded bits input from the coding unit 3071, in compliance with the modulation scheme such as BPSK, QPSK, 16 QAM, 64 QAM or 256 QAM.

The downlink reference signal generation unit 3079 generates, as the downlink reference signal, a sequence that is already known to the terminal apparatus 1 and that is acquired in accordance with a rule prescribed in advance based on the physical cell identity (PCI) for identifying the base station apparatus 3, or the like.

The multiplexing unit 3075, in accordance with the number of PSCH layers to be spatial-multiplexed, maps one or multiple pieces of downlink data to be transmitted on one PSCH to one or multiple layers, and performs precoding on the one or multiple layers. The multiplexing unit 375 multiplexes the downlink physical channel signal and the downlink reference signal for each transmit antenna port. Furthermore, the multiplexing unit 375 allocates the downlink physical channel signal and the downlink reference signal to the resource element for each transmit antenna port.

The radio transmission unit 3077 performs Inverse Fast Fourier Transform (IFFT) on the modulation symbol resulting from the multiplexing or the like, performs the modulation in compliance with an OFDM scheme to generate an OFDM symbol, attaches the Guard Interval to the OFDM-modulated OFDM symbol, generates a digital signal in a baseband, converts the digital signal in the baseband into an analog signal, generates an in-phase component and an orthogonal component of an intermediate frequency from the analog signal, removes frequency components unnecessary for the intermediate frequency band, converts (up-converts) the signal of the intermediate frequency into a signal of a high frequency signal, removes unnecessary frequency components, performs power amplification, and outputs a final result to the transmit and/or receive antenna 309 for transmission.

(1) More specifically, the base station apparatus 3 according to the first aspect of the present invention, includes a coding unit to determine the number of code block groups, divide an input bit sequence to code block segmentation into code block groups of the number of code block groups, determine the number of code blocks for each of the code block groups, divide each of the code block groups into code blocks of the number of code blocks, and apply a channel coding to each of the code blocks.

(2) In the first aspect described above, the number of code block groups is determined based on the number of OFDM symbols.

(3) In the first aspect described above, the number of code blocks in the first code block group is determined based on the number of resource elements included in one or more OFDM symbols corresponding to the first code block group.

(4) In the first aspect described above, the input bit sequence to the code block segmentation is a bit sequence in which a Cyclic Redundancy Check (CRC) sequence is attached to the transport block.

(5) In the first aspect described above, the number of OFDM symbols is determined based on information indicated by a higher layer or a physical link control channel.

(6) The terminal apparatus 1 according to the second aspect of the present invention, includes a coding unit to determine the number of code block groups, divide an input bit sequence to code block segmentation into code block groups of the number of code block groups, determine the number of code blocks for each of the code block groups, divide each of the code block groups into code blocks of the number of code blocks, and apply a channel coding to each of the code blocks.

(7) In the second aspect described above, the number of code block groups is determined based on the number of OFDM symbols.

(8) In the second aspect described above, the number of code blocks in the first code block group is determined based on the number of resource elements included in one or more OFDM symbols corresponding to the first code block group.

(9) In the second aspect described above, the input bit sequence to the code block segmentation is a bit sequence in which a Cyclic Redundancy Check (CRC) sequence is attached to the transport block.

(10) In the second aspect described above, the number of OFDM symbols is determined based on information indicated by a higher layer or a physical link control channel.

(11) The communication method according to the third aspect of the present invention, determines the number of code block groups, divides an input bit sequence to code block segmentation into code block groups of the number of code block groups, determines the number of code blocks for each of the code block groups, divides each of the code block groups into code blocks of the number of code blocks, and applies a channel coding to each of the code blocks.

(12) The integrated circuit according to the third aspect of the present invention, includes a method for determining the number of code block groups, dividing an input bit sequence to code block segmentation into code block groups of the number of code block groups, determining the number of code blocks for each of the code block groups, dividing each of the code block groups into code blocks of the number of code blocks, and applying a channel coding to each of the code blocks.

A program running on an apparatus according to one aspect of the present invention may serve as a program that controls a Central Processing Unit (CPU) and the like to cause a computer to operate in such a manner as to realize the functions of the embodiment according to one aspect of the present invention. Programs or the information handled by the programs are temporarily stored in a volatile memory such as a Random Access Memory (RAM), a non-volatile memory such as a flash memory or a Hard Disk Drive (HDD), or another storage system.

Furthermore, a program for realizing the functions of the embodiment according to one aspect of the present invention may be stored in a computer readable recording medium. The functions may be realized by causing a computer system to read and perform the program recorded on this recording medium. It is assumed that the "computer system" refers to a computer system built into the apparatuses, and the computer system includes an operating system and hardware components such as a peripheral device. Further, the "computer-readable recording medium" may include a semiconductor recording medium, an optical recording medium, a magnetic recording medium, a medium that holds a program dynamically for a short period of time, or another recording medium that can be read by a computer.

Furthermore, each functional block or various characteristics of the apparatuses used in the above-described embodiment may be implemented or performed on an electric circuit, for example, an integrated circuit or multiple integrated circuits. An electric circuit designed to perform the functions described in the present specification may include a general-purpose processor, a Digital Signal Processor (DSP), an Application Specific Integrated Circuit (ASIC), a Field Programmable Gate Array (FPGA), or other programmable logic devices, discrete gates or transistor logic, discrete hardware components, or a combination thereof. The general-purpose processor may be a microprocessor, or may be a conventional processor, a controller, a micro-controller, or a state machine. The above-described electric circuit may be constituted of a digital circuit, or may be constituted of an analog circuit. Furthermore, in a case that with advances in semiconductor technology, a circuit integration technology appears that replaces the present integrated circuits, one or more aspects of the present invention can use a new integrated circuit based on the technology.

Note that the invention of the present patent application is not limited to the above-described embodiments. In the embodiment, apparatuses have been described as an example, but the invention of the present application is not limited to these apparatuses, and is applicable to a terminal apparatus or a communication apparatus of a fixed-type or a stationary-type electronic apparatus installed indoors or outdoors, for example, an AV apparatus, a kitchen apparatus, a cleaning or washing machine, an air-conditioning apparatus, office equipment, a vending machine, and other household apparatuses.

The embodiments of the present invention have been described in detail above referring to the drawings, but the specific configuration is not limited to the embodiments and includes, for example, an amendment to a design that falls within the scope that does not depart from the gist of the present invention. Furthermore, various modifications are possible within the scope of one aspect of the present invention defined by claims, and embodiments that are made by suitably combining technical means disclosed according to the different embodiments are also included in the technical scope of the present invention. Furthermore, a configuration in which constituent elements, described in the respective embodiments and having mutually the same effects, are substituted for one another is also included in the technical scope of the present invention.

INDUSTRIAL APPLICABILITY

One aspect of the present invention can be applied to, for example, a communication system, a communication apparatus (for example, a mobile phone apparatus, a base station apparatus, a wireless LAN apparatus, or a sensor device), an integrated circuit (for example, a communication chip), a program or the like.

REFERENCE SIGNS LIST 1 (1A, 1B, 1C) Terminal apparatus
3 Base station apparatus
10 Turbo code internal interleaver
11, 12 Constituent encoder
20 Subblock interleaver
21 Bit collection unit
22 Bit selection unit
30 Turbo code internal interleaver
31, 32 Constituent encoder
40 Subblock interleaver
41 Bit collection unit
42 Bit selection unit
50 Step of setting transport block size from the channel state and the number of symbols
51 Step of performing code block segmentation and CRC attachment
52 Step of performing channel coding
53 Step of codeword combining and rate matching
60 Step of performing code block group segmentation
61 Step of performing code block segmentation
62 Step of performing channel coding
63 Step of codeword combining and rate matching
70 Step of calculating the number M of codeword bits after rate matching, from the number of OFDM symbols and the number of resource elements
71 Step of calculating the number Y of bits before channel coding, from the number M of codeword bits
72 Step of dividing the transport block in units of Y bits, and calculating the number of bits B" of each code block group
101 Higher layer processing unit
103 Controller
105 Receiver
107 Transmitter
109 Antenna
301 Higher layer processing unit
303 Controller
305 Receiver
307 Transmitter
1013 Scheduling information interpretation unit
1015 Channel State Information report control unit
1051 Decoding unit
1053 Demodulation unit
1055 Demultiplexing unit
1057 Radio reception unit
1059 Measurement unit
1071 Coding unit
1073 Modulation unit
1075 Multiplexing unit
1077 Radio transmission unit
1079 Uplink reference signal generation unit
3011 Radio resource control unit
3013 Scheduling unit
3015 Channel State Information report control unit
3051 Decoding unit
3053 Demodulation unit
3055 Demultiplexing unit
3057 Radio reception unit
3059 Measuring unit
3071 Coding unit
3073 Modulation unit
3075 Multiplexing unit
3077 Radio transmission unit
3079 Downlink reference signal generation unit

The invention claimed is:
1. A terminal device comprising:
   determination circuitry configured to determine a determined number of code block groups, wherein the determined number of code block groups is determined based in part on transport block size;

code block segmentation circuitry configured to segment the input bit sequence into a plurality of code blocks based on a parameter related to a maximum size of each code block; and encoding circuitry configured to perform channel encoding of each of the plurality of code blocks based on low density parity check (LDPC) coding, wherein the determined number of code block groups is determined based in part on the maximum size of each code block, wherein a cyclic redundancy check parity bit is attached to each of the code blocks of the code block groups, and wherein the encoding circuitry is configured to report a hybrid automatic repeat request (HARQ) information bit for each code block group indicative of whether all of the code blocks of each code block group were correctly received.

2. The terminal device of claim 1, wherein the code block segmentation circuitry is configured to attach a cyclic redundancy check to the input bit sequence.

3. The terminal device of claim 1, wherein each cyclic redundancy check provides error detection to the code block to which that cyclic redundancy check is attached.

4. A method for a terminal device, the method comprising:
determining, by determination circuitry, a determined number of code block groups, wherein the determined number of code block groups is determined based in part on transport block size;
segmenting, by code block segmentation circuitry, the input bit sequence into a plurality of code blocks based on a parameter related to a maximum size of each code block;
performing, by encoding circuitry, channel encoding of each of the plurality of code blocks based on low density parity check (LDPC) coding, wherein the determined number of code block groups is determined based in part on the maximum size of each code block, wherein a cyclic redundancy check parity bit is attached to each of the code blocks of the code block groups; and
reporting, by the encoding circuitry, a hybrid automatic repeat request (HARQ) information bit for each code block group indicative of whether all of the code blocks of each code block group were correctly received.

5. The method of claim 4, wherein the code block segmentation circuitry attaches a cyclic redundancy check to the input bit sequence.

6. A base station device comprising:
determination circuitry configured to determine a determined number of code block groups, wherein the determined number of code block groups is determined based in part on transport block size;
code block segmentation circuitry configured to segment the input bit sequence into a plurality of code blocks based on a parameter related to a maximum size of each code block; and
encoding circuitry configured to perform channel encoding of each of the plurality of code blocks based on low density parity check (LDPC) coding, wherein the determined number of code block groups is determined based in part on the maximum size of each code block, wherein a cyclic redundancy check parity bit is attached to each of the code blocks of the code block groups, and wherein the encoding circuitry is configured to report a hybrid automatic repeat request (HARQ) information bit for each code block group indicative of whether all of the code blocks of each code block group were correctly received.

7. The base station device of claim 6, wherein the code block segmentation circuitry is configured to attach a cyclic redundancy check to the input bit sequence.

8. A method for a base station, the method comprising:
determining, by determination circuitry, a determined number of code block groups, wherein the determined number of code block groups is determined based in part on transport block size;
segmenting, by code block segmentation circuitry, the input bit sequence into a plurality of code blocks based on a parameter related to a maximum size of each code block; and
performing, by encoding circuitry, channel encoding of each of the plurality of code blocks based on low density parity check (LDPC) coding, wherein the determined number of code block groups is determined based in part on the maximum size of each code block, wherein a cyclic redundancy check parity bit is attached to each of the code blocks of the code block groups; and
reporting, by the encoding circuitry, a hybrid automatic repeat request (HARQ) information bit for each code block group indicative of whether all of the code blocks of each code block group were correctly received.

9. The method of claim 8, wherein the code block segmentation circuitry attaches a cyclic redundancy check to the input bit sequence.

* * * * *